(12) United States Patent
Tsuno

(10) Patent No.: US 11,187,952 B2
(45) Date of Patent: Nov. 30, 2021

(54) LIQUID CRYSTAL DISPLAY DEVICE AND ELECTRONIC APPARATUS

(71) Applicant: SONY CORPORATION, Tokyo (JP)

(72) Inventor: Hitoshi Tsuno, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 524 days.

(21) Appl. No.: 16/087,544

(22) PCT Filed: Mar. 10, 2017

(86) PCT No.: PCT/JP2017/009751
§ 371 (c)(1),
(2) Date: Sep. 21, 2018

(87) PCT Pub. No.: WO2017/169663
PCT Pub. Date: Oct. 5, 2017

(65) Prior Publication Data
US 2021/0200007 A1    Jul. 1, 2021

(30) Foreign Application Priority Data
Mar. 31, 2016    (JP) .............................. JP2016-070100

(51) Int. Cl.
*G02F 1/1343*    (2006.01)
*G02F 1/1368*    (2006.01)

(52) U.S. Cl.
CPC .................................. *G02F 1/1368* (2013.01)

(58) Field of Classification Search
CPC .................................................... G02F 1/1368
See application file for complete search history.

(56) References Cited

U.S. PATENT DOCUMENTS

2002/0008800 A1*    1/2002    Matsumoto ....... G02F 1/136209
                                                                    349/44
2003/0189685 A1*    10/2003    Choi .................... G02F 1/1345
                                                                    349/149

(Continued)

FOREIGN PATENT DOCUMENTS

CN    100371812 C    2/2008
CN    101135818 A    3/2008

(Continued)

OTHER PUBLICATIONS

International Search Report and Written Opinion of PCT Application No. PCT/JP2017/009751, dated May 30, 2017, 09 pages of ISRWO.

(Continued)

*Primary Examiner* — Sang V Nguyen
(74) *Attorney, Agent, or Firm* — Chip Law Group

(57) ABSTRACT

Provided is a liquid crystal display device that includes an effective pixel portion, a pixel drive portion, and a dummy pixel portion adjacent to the effective pixel portion. The effective pixel portion comprises effective pixels contributing to display. The dummy pixel portion includes dummy pixels not contributing to the display. The pixel drive portion drives the effective pixels of the effective pixel portion and the dummy pixels of the dummy pixel portion by reversing a voltage applied to a liquid crystal with a given period with a reference voltage as a center. The effective pixels and the dummy pixels each have a pixel transistor and a retention capacitor. In addition, with respect to retention characteristics of a pixel electric potential in relation to the reference voltage, the retention characteristics of the dummy pixel portion are made asymmetrical relative to the retention characteristics of the effective pixel portion.

12 Claims, 16 Drawing Sheets

(56) References Cited

U.S. PATENT DOCUMENTS

| | | | | |
|---|---|---|---|---|
| 2010/0134667 A1* | 6/2010 | Suzuki | ............... | H04N 5/3572 |
| | | | | 348/294 |
| 2013/0128210 A1* | 5/2013 | Nagasawa | ............. | G02F 1/1345 |
| | | | | 349/151 |
| 2014/0307190 A1 | 10/2014 | Tomikawa | | |

FOREIGN PATENT DOCUMENTS

| | | |
|---|---|---|
| CN | 104103250 A | 10/2014 |
| JP | 07-333654 A | 12/1995 |
| JP | 2005-077636 A | 3/2005 |
| JP | 2007-316119 A | 12/2007 |
| JP | 2010-026032 A | 2/2010 |
| JP | 2014-206622 A | 10/2014 |

OTHER PUBLICATIONS

Office Action for JP Patent Application No. 2018-508934, dated May 11, 2021, 04 pages of English Translation and 04 pages of Office Action.

Office Action for CN Patent Application No. 201780018743.3, dated Jun. 29, 2021, 4 pages of Office Action and 2 pages of English Translation.

* cited by examiner

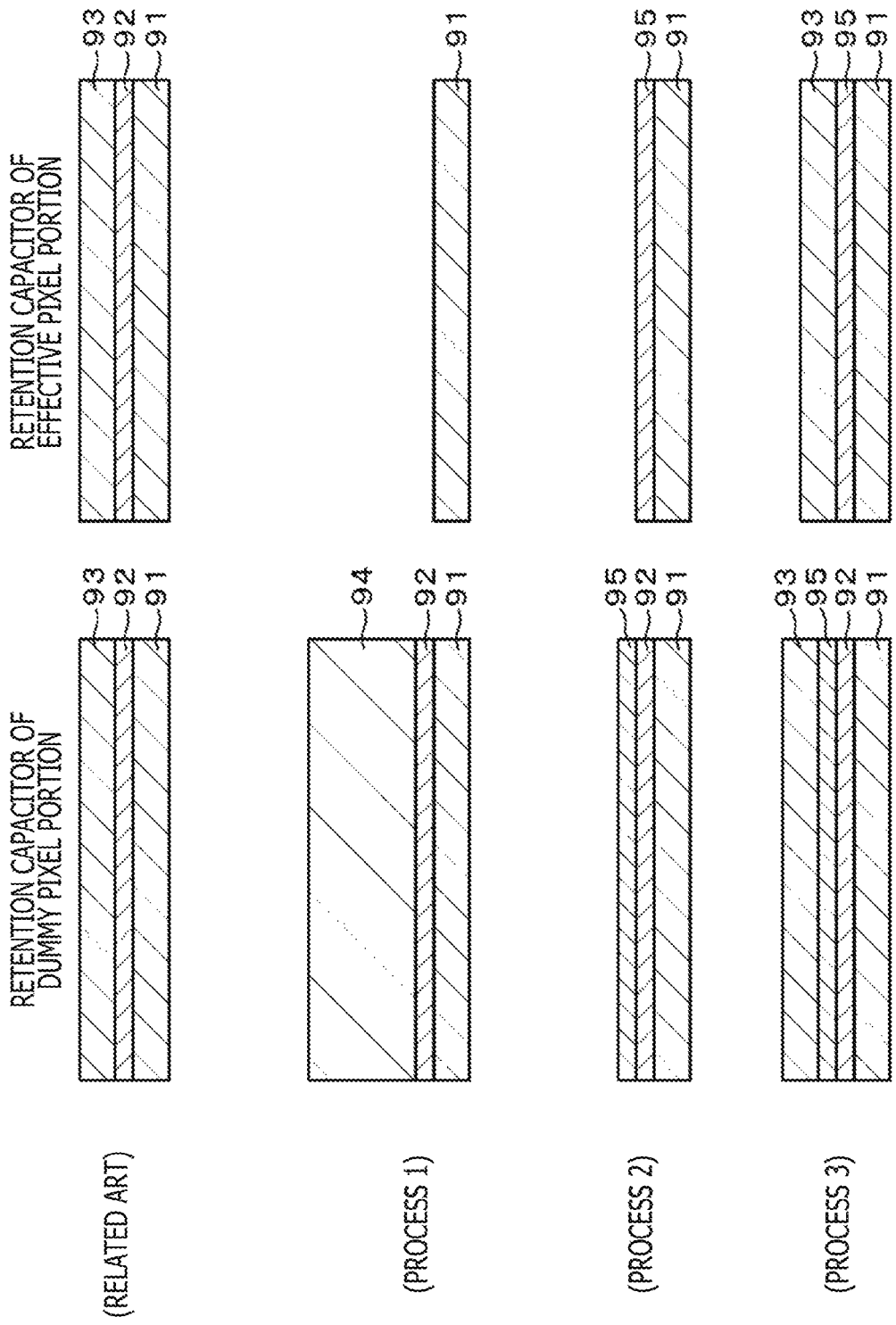

LIQUID CRYSTAL DISPLAY DEVICE AND ELECTRONIC APPARATUS

CROSS REFERENCE TO RELATED APPLICATIONS

This application is a U.S. National Phase of International Patent Application No. PCT/JP2017/009751 filed on Mar. 10, 2017, which claims priority benefit of Japanese Patent Application No. JP 2016-070100 filed in the Japan Patent Office on Mar. 31, 2016. Each of the above-referenced applications is hereby incorporated herein by reference in its entirety.

TECHNICAL FIELD

The present disclosure relates to a liquid crystal display device and an electronic apparatus.

BACKGROUND ART

In a liquid crystal display device, ionic impurities from a liquid crystal, a sealing material or the like are present in a liquid crystal panel which is formed by enclosing a liquid crystal in a space between two sheets of substrates in some cases. When the ionic impurities stay in a specific portion of a display area by driving of the liquid crystal panel, a retention rate of the liquid crystal is reduced and is visually recognized as burn-in. The burn-in is a phenomenon that in the case where the same image is repetitively displayed, or the like, when a current screen is switched over to a next screen, the previous image is visually recognized in the form of a residual image.

Therefore, for realizing the display having the less burn-in, it becomes important to reduce the ionic impurities, in the liquid crystal layer, which cause the burn-in. However, it is difficult to perfectly exclude the ionic impurities in terms of the material property. For this reason, the ionic impurities are conventionally made trapped in the periphery of the display area, thereby reducing the burn-in. For example, a dummy pixel area is provided in the periphery of the display area, and a voltage smaller than a threshold voltage (2 V at most) with which a transmittance of the liquid crystal is changed is applied across the dummy pixel electrode and a common electrode (for example, refer to PTL 1).

CITATION LIST

Patent Literature

[PTL 1]
Japanese Patent Laid-Open No. 2014-206622

SUMMARY

Technical Problem

In the related art described in PTL 1, the dummy pixel electrode is made to function as an electron parting portion, and the ionic impurities are drawn (trapped) from the display area to the dummy pixel electrode, thereby promoting the reduction of the ionic impurities. However, in case of the related art described in PTL 1, since the voltage applied across the dummy pixel electrode and the common electrode is approximately 2 V at most, the ability to trap the ionic impurities is weak. Moreover, the flow made by the liquid crystal molecules is disturbed in an end of the display area, which becomes a barrier in the case where the ionic impurities are discharged to the dummy pixel area.

It is an object of the present disclosure to provide a liquid crystal display device and an electronic apparatus having the liquid crystal display device in each of which ionic impurities in a liquid crystal layer of an effective pixel portion are more reliably discharged to a dummy pixel portion, and the ionic impurities are trapped in the dummy pixel portion concerned, thereby enabling burn-in to be improved.

Solution to Problem

A liquid crystal display device of the present disclosure for attaining the object described above, includes:

an effective pixel portion in which effective pixels contributing to display are arranged;

a dummy pixel portion which is provided adjacent to the effective pixel portion and in which dummy pixels not contributing to the display are arranged; and a pixel drive portion configured to drive the effective pixels of the effective pixel portion and the dummy pixels of the dummy pixel portion by reversing a voltage applied to a liquid crystal with a given period with a reference voltage as a center, in which the effective pixel portion and the dummy pixels each have a pixel transistor and a retention capacitor, and with respect to retention characteristics of a pixel electric potential in relation to the reference voltage, the retention characteristics of the dummy pixel portion are made asymmetrical relative to the retention characteristics of the effective pixel portion. In addition, an electronic apparatus of the present disclosure for attaining the object described above has the liquid crystal display device having the configuration described above.

In the liquid crystal display device having the configuration described above, or the electronic apparatus having the liquid crystal display device concerned, the retention characteristics of the dummy pixel portion are made asymmetrical relative to the retention characteristics of the effective pixel portion. As a result, a DC (direct current) voltage component generated in the liquid crystal layer by reverse drive becomes larger in the dummy pixel portion than in the effective pixel portion. Then, ionic impurities in the liquid crystal layer of the effective pixel portion are trapped in an alignment film of the dummy pixel portion by an operation of the DC voltage component generated in the liquid crystal layer of the dummy pixel portion.

Advantageous Effect of Invention

According to the present disclosure, the ionic impurities in the liquid crystal layer of the effective pixel portion are trapped in the alignment film of the dummy pixel portion by the operation of the DC voltage component generated in the liquid crystal layer of the dummy pixel portion. As a result, the ionic impurities in the liquid crystal layer of the effective pixel portion can be more reliably discharged to the dummy pixel portion.

It should be noted that the effect described here is not necessarily limited, and any of the effects described in the present description may be available. In addition, the effects described in the present description are merely exemplifications, and thus are by no means limited thereto, and there may be additional effect.

BRIEF DESCRIPTION OF DRAWINGS

FIG. 15 is a process chart depicting a procedure of a method of manufacturing retention capacitors of the effective pixel and the dummy pixel according to Example 5.

DESCRIPTION OF EMBODIMENT

Figure 1:
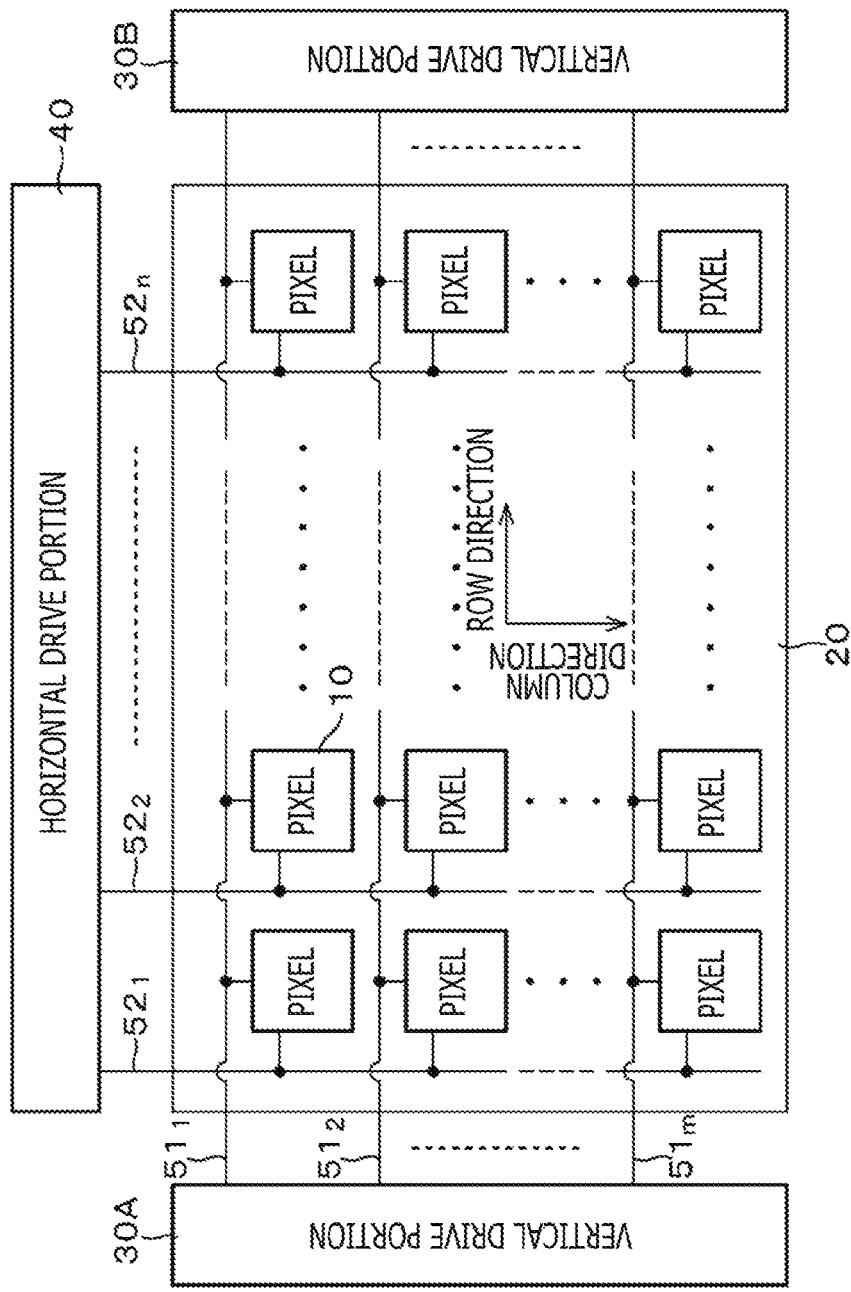
FIG. 1 is a block diagram depicting an example of a system configuration of an active-matrix type liquid crystal display device to which the technique of the present disclosure is applied.

Hereinafter, a mode for carrying out the technique of the present disclosure (hereinafter, described as "an embodiment") will be described in detail with reference to the drawings. The technique of the present disclosure is by no means limited to the embodiment, and various numeral values and materials in the embodiment are exemplifications. In the following description, the same constituent elements or the constituent elements having the same functions shall be assigned the same reference signs, and a repeated description is omitted here. It should be noted that the description will be given in accordance with the following order.

1. Description regarding the whole of liquid crystal display device and electronic apparatus of the present disclosure
2. Liquid crystal display device to which the technique of the present disclosure is applied
   2-1. System configuration
   2-2. Circuit configuration of pixel
   2-3. Planar structure of display panel
   2-4. Flow of ionic impurities
3. Embodiment of the present disclosure
   3-1. Example 1 (an example in which a length of an LDD region is made asymmetrical between one side of source/drain regions and the other side of the source/drain regions)
   3-2. Example 2 (an example in which a concentration of an LDD region is made asymmetrical between one side of source/drain regions and the other side of the source/drain regions)
   3-3. Example 3 (an example in which a thickness of a gate insulating film is made asymmetrical between one side of source/drain regions and the other side of the source/drain regions)
   3-4. Example 4 (an example in which a distance between a contact portion for a gate electrode and an LDD region is made asymmetrical between one side of source/drain regions and the other side of the source/drain regions)
   3-5. Example 5 (an example in which a capacitance value of a retention capacitor in a dummy pixel is made smaller than a capacitance value of a retention capacitor in an effective pixel)
4. Electronic apparatus of the present disclosure (an example of a projection display device)
5. Constitutions of the present disclosure

Description Regarding the Whole of Liquid Crystal Display Device and Electronic Apparatus of the Present Disclosure In a liquid crystal display device and an electronic apparatus of the present disclosure, the liquid crystal display device may be of a transmission type in which display is carried out by transmitting/blocking light from a light source (backlight) placed on a back surface of a screen, or may be of a reflection type in which display is carried out by reflection of external light as a light source. In addition, the technique of the present disclosure can respond to the liquid crystal display devices in all liquid crystal modes irrespective of the liquid crystal modes.

Then, in the liquid crystal display device and the electronic apparatus of the present disclosure, characteristics of a pixel transistor can be made different between an effective pixel of an effective pixel portion and a dummy pixel of a dummy pixel portion.

In the liquid crystal display device and the electronic apparatus of the present disclosure each including the preferred configuration described above, when a pixel transistor has a low-concentrated impurity drain region, with respect to the pixel transistor in the dummy pixel portion, a length of the low-concentrated impurity drain region can be made asymmetrical between one side of source/drain regions, and the other side of source/drain regions. Alternatively, a concentration of the low-concentrated impurity drain region can be made asymmetrical between one side of the source/drain regions, and the other side of the source/drain regions. In addition, with respect to the dummy pixel, a film thickness of a gate insulating film can be made asymmetrical between one side of the source/drain regions, and the other side of the source/drain regions.

In addition, in the liquid crystal display device and the electronic apparatus of the present disclosure each including the preferred configuration described above, when the pixel transistor has the low-concentrated impurity drain region and a contact portion for the gate electrode is formed along a gate length direction in the vicinity of the low-concentrated impurity drain region, with respect to the dummy pixel, the distance between the low-concentrated impurity drain region and the contact portion can be made asymmetrical between one side of the source/drain regions, and the other side of the source/drain regions.

Alternatively, in the liquid crystal display device and the electronic apparatus of the present disclosure each including the preferred configuration described above, a capacitance value of a retention capacitor of the dummy pixel can be made smaller than a capacitance value of a retention capacitor of the effective pixel.

Alternatively, in the liquid crystal display device and the electronic apparatus of the present disclosure each including the preferred configuration described above, a pixel drive portion can be configured to carry out the same drive as that, for the effective pixel, for the dummy pixel.

Alternatively, in the liquid crystal display device and the electronic apparatus of the present disclosure each including the preferred configuration described above, when an alignment film is formed on a liquid crystal side of the pixel electrode, and a liquid crystal side of a counter electrode opposite to the pixel electrode, the alignment film can be composed of an oblique deposition film. Moreover, the dummy pixel can be light-blocked.

Liquid Crystal Display Device to which the Technique of the Present Disclosure is Applied Firstly, the liquid crystal display device to which the present technique of the present disclosure is applied will be described by giving, as an example, an active-matrix type liquid crystal display device. The active-matrix type liquid crystal display device is a display device using a so-called active-matrix drive system in which independent pixel electrodes are arranged for the respective pixels, and switching elements are individually connected to the pixel electrodes, thereby selectively driving the pixel.

In the active-matrix type liquid crystal display device, a liquid crystal is enclosed in a space between two sheets of substrates: a first substrate; and a second substrate, thereby configuring a liquid crystal panel. The first substrate is a TFT substrate in which a TFT (Thin Film Transistor), for example, is formed as a switching element. The second substrate is a counter substrate in which a color filter, a counter electrode, and the like are formed, and which is provided so as to be opposite to the TFT substrate. Then, in the liquid crystal panel, the orientation of the liquid crystal is controlled by the switching control made by the switching element, and the voltage application based on a video signal so as to change the transmittance of the light, thereby carrying out the video display.

In the active-matrix type liquid crystal display device, there is carried out the reverse drive in which the voltage applied to the liquid crystal is reversed with a given period with a reference voltage as a center by using an AC (alternating current)-driven analog video signal. Here, "the AC-driven analog video signal" means an analog video signal the polarity of which is reversed with a predetermined period with a reference voltage $V_{COM}$ (hereinafter, referred to as "a common voltage $V_{COM}$") as a center. In the case where a DC voltage having the same polarity is continuously applied to the liquid crystal, a specific resistance (resistance value specific to a material) or the like of the liquid crystal becomes easy to deteriorate. However, the analog video signal is AC-driven, thereby enabling the deterioration of the liquid crystal to be prevented.

System Configuration

FIG. 1 depicts an example of a system configuration of the active-matrix type liquid crystal display device to which the technique of the present disclosure is applied. As depicted in FIG. 1, the active-matrix type liquid crystal display device pertaining to the present application example has a pixel array portion 20 and a pixel drive portion for driving pixels 10 of the pixel array portion 20. In the pixel array portion 20, the pixels 10 are two-dimensionally arranged in a row direction and in a column direction. The pixel drive portion includes vertical drive portions 30A and 30B for successively selecting the pixels 10 in the pixel array portion 20 in units of a row, and a horizontal drive portion 40 for supplying an AC-driven analog video signal to each of the pixels 10 selected in units of a row.

The pixel array portion 20 has a pixel array of m-by-n matrix. For the pixel array of m-by-n matrix, a scanning line 51 ($51_1$, $51_2$, . . . , $51_m$) is wired every pixel row, and a signal line 52 ($52_1$, $52_2$, . . . , $52m$) is wired every pixel column. Both ends of the scanning line 51 are connected to output ends of corresponding row in the vertical drive portion 30A and the vertical drive portion 30B. One end of the signal line 52 is connected to an output terminal of corresponding column in the horizontal drive portion 40.

It should be noted that although in this example, a configuration of both-side drive in which the vertical drive portion 30A and the vertical drive portion 30B are arranged so as to sandwich the pixel array portion 20 between them is given as the example, a configuration of one-side drive in which the vertical drive portion is arranged only on one side of the pixel array portion 20 can also be adopted. However, as compared with the case of the configuration of the one-side drive, the configuration of the both-side drive offers the effect that the propagation delay of the scanning signal which is transmitted to each of the pixels 10 in units of the row by the scanning line 51 can be reduced.

Circuit Configuration of Pixel

Figure 2A:
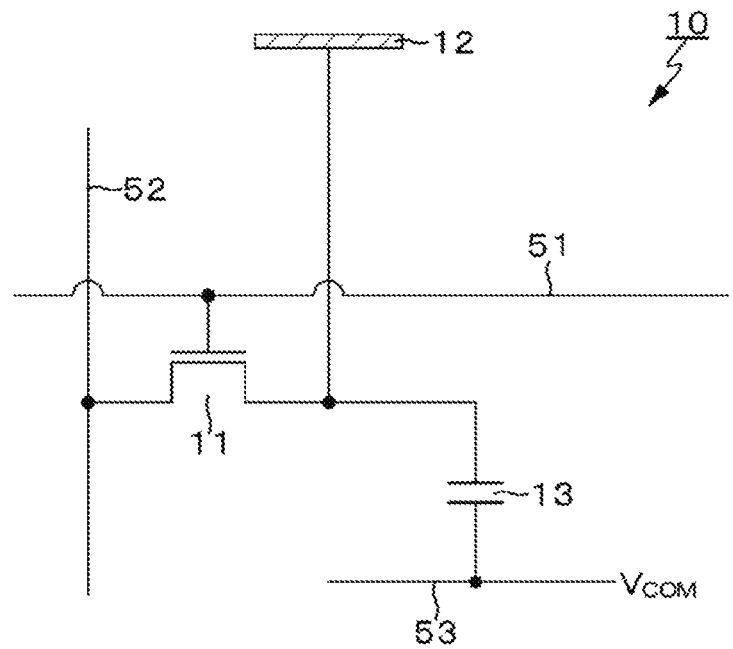
FIG. 2A is a circuit diagram depicting an example of a circuit configuration of a pixel.

FIG. 2A depicts an example of a circuit configuration of the pixel 10. As depicted in FIG. 2A, the pixel 10 has a pixel transistor, for example, a thin film transistor 11 as a switching element. The thin film transistor 11 is connected in gate electrode thereof to the scanning lines 51 ($51_1$, $51_2$, . . . , $51_m$), and is connected in source electrode thereof to the signal line 52 ($52_1$, $52_2$, . . . , $52m$). The thin film transistor 11 writes a video signal (pixel electric potential) supplied thereto through the signal line 52 to the pixel 10.

A pixel electrode 12 is connected to a drain electrode of the thin film transistor 11. One electrode of a retention capacitor 13 is further connected to the drain electrode of the thin film transistor 11. The retention capacitor 13 retains therein the pixel electric potential written thereto by the thin film transistor 11. The other electrode of the retention capacitor 13 is connected to the common line 53. The common line 53 is given a predetermined DC voltage or AC voltage as the common voltage $V_{COM}$. The common voltage $V_{COM}$ becomes a reference voltage during the reverse drive. It should be noted that in FIG. 1, for simplification of the drawing, illustration of the common line 53 is omitted.

Planar Structure of Display Panel

Figure 2B:
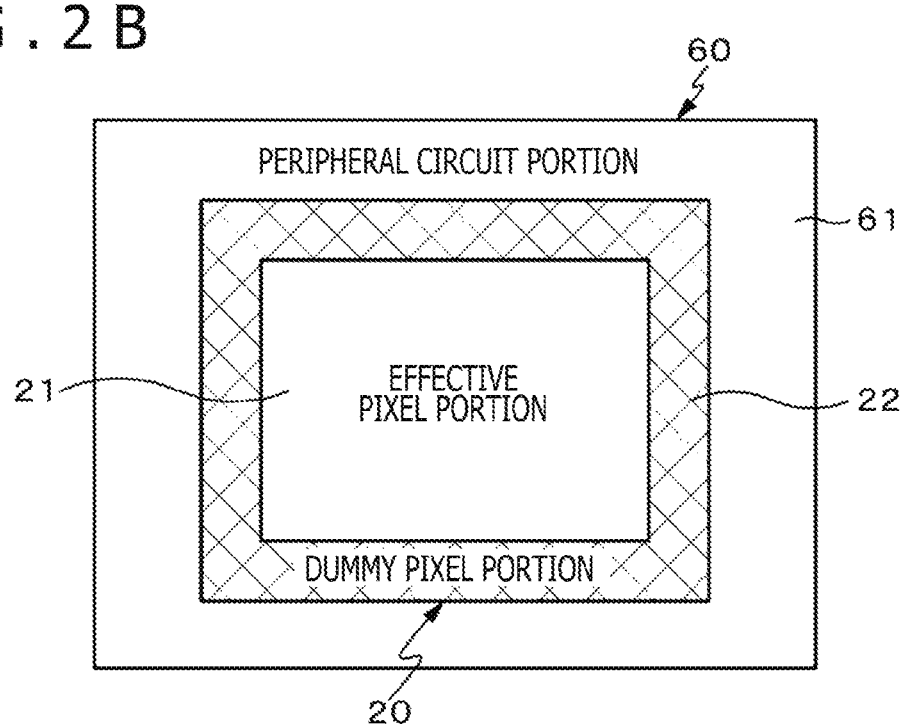
FIG. 2B is a top plan view depicting a schematic configuration of a planar structure of a liquid crystal panel.

A description will now be given with respect to a structure of the liquid crystal panel formed by enclosing the liquid crystal in the space between two sheets of substrates. FIG. 2B depicts a schematic configuration of a planar structure of the liquid crystal panel. As depicted in FIG. 2B, the liquid crystal panel 60 has a peripheral circuit portion 61 in the periphery of the pixel array portion 20 in which the pixels 10 are two-dimensionally arranged in the row direction and in the column direction. A pixel drive portion including the vertical drive portions 30A and 30B, the horizontal drive portion 40, and the like described above is arranged in the peripheral circuit portion 61.

The pixel array portion 20 is composed of an effective pixel portion (effective pixel area) 21, and a dummy pixel portion (dummy pixel area) 22. In this case, effective pixels which contribute to the display are arranged in the effective pixel portion 21. The dummy pixel portion 22 is provided adjacent to the effective pixel portion 21, and dummy pixels which does not contribute to the display are arranged in the dummy pixel portion 22. Each of the pixels of the effective pixel portion 21, and each of the pixels of the dummy pixel portion 22 have the same circuit configuration. That is, as depicted in FIG. 2A, each of the pixels of the effective pixel portion 21, and each of the pixels of the dummy pixel portion 22 have the same circuit configuration having a thin film transistor 11, a pixel electrode 12, and a retention capacitor 13.

However, each of the pixels of the effective pixel portion 21 has an opening portion through which the incident light is taken in, whereas each of the pixels of the dummy pixel portion 22 has a light-blocking structure in which an aperture ratio is set to zero. The dummy pixel portion 22 having the light-blocking structure is an area (details thereof will be described later) which is provided for trapping the ionic impurities in the liquid crystal layer of the effective pixel portion 21. When the ionic impurities stay in a specific portion of the effective pixel portion 21 by the drive in the liquid crystal panel 60, the retention rate of the liquid crystal is reduced, and the staying ionic impurities are visually recognized in the form of the burn-in. Therefore, for realizing the image having the less burn-in, it becomes important to reduce an amount of ionic impurities, in the liquid crystal layer, which cause the burn-in.

Flow of Ionic Impurities

Figure 3:
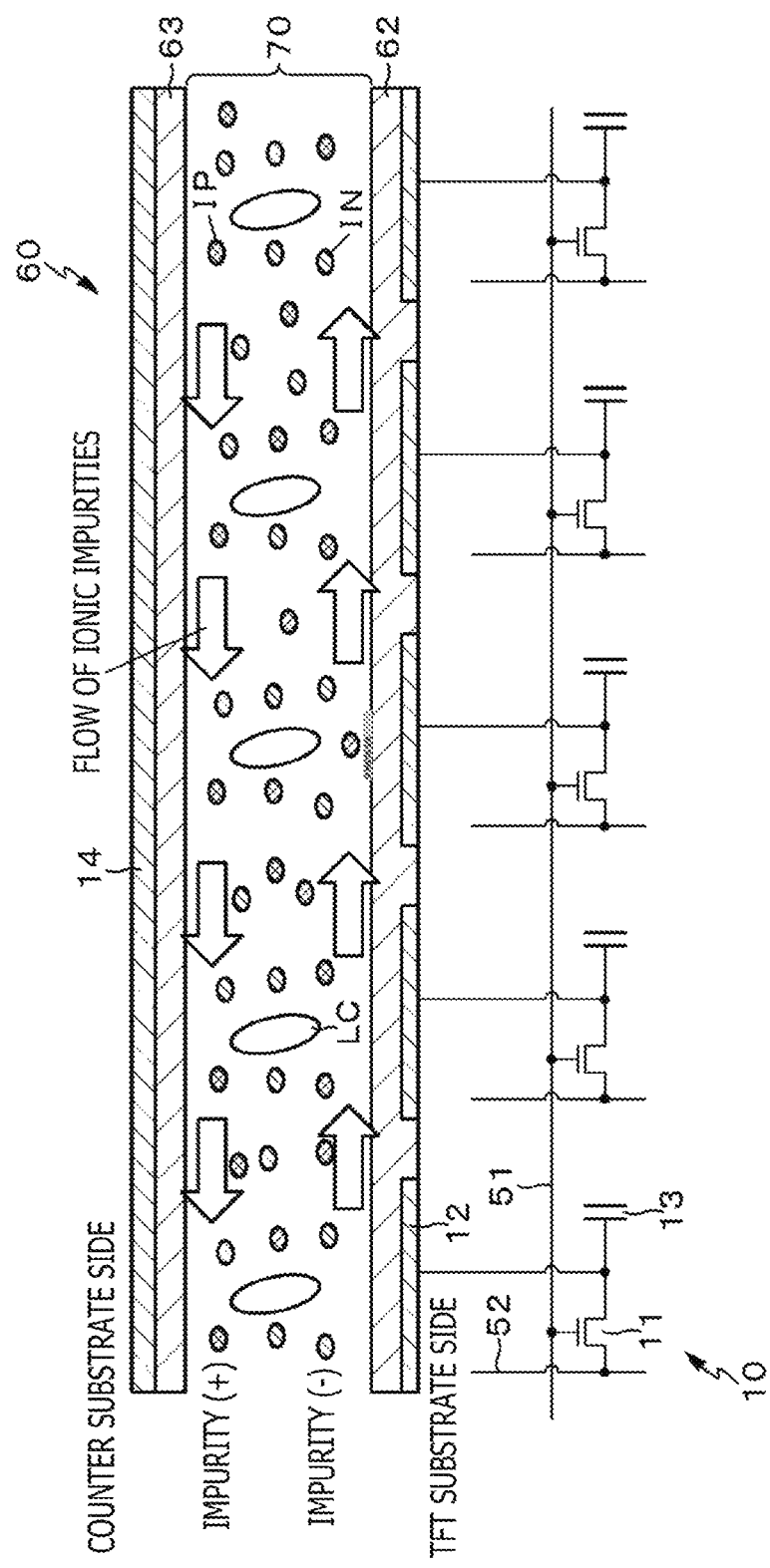
FIG. 3 is a cross-sectional view of a display panel schematically depicting a flow of ionic impurities in a liquid crystal layer.

Here, a description will be given with respect to a flow of the ionic impurities in the liquid crystal layer causing the burn-in with reference to FIG. 3. FIG. 3 is a cross-sectional view of the display panel 60 schematically depicting the flow of the ionic impurities in the liquid crystal layer. In FIG. 3, void arrows indicate the flow of the ionic impurities.

The display panel 60 has a structure in which the liquid crystal layer 70 is interposed between the TFT substrate as the first substrate and the counter substrate as the second substrate. In this case, the liquid crystal molecules LC are enclosed in the space between the TFT substrate and the counter substrate, thereby forming the liquid crystal layer 70 (in FIG. 3, illustration of the TFT substrate and the counter substrate is omitted). On the TFT substrate side, a pixel electrode 12, for example, made of an ITO (indium tin oxide) is provided in units of a pixel (every pixel). Then, on an inner side of the pixel electrode 12 (on the liquid crystal layer 70 side), an alignment film 62 is formed inside the pixel electrode 12 so as to cover the pixel electrode 12.

On the other hand, on the counter substrate side, a common electrode 14, for example, made of ITO, is provided so as to be common to all the pixels. The common voltage $V_{COM}$ is applied to the common electrode 14. Then, on an inner side (on the liquid crystal layer 70) side of the common electrode 14, an alignment film 63 is formed over the entire surface of the common electrode 14. The alignment film 62 on the TFT substrate side, and the alignment film 63 on the counter substrate side, for example, are each formed of an oblique deposition film which is formed through the oblique deposition from a predetermined direction.

In the display panel 60 having the structure described above, an AC voltage is applied across the pixel electrode 12 and the common electrode 14 to drive the liquid crystal layer 70. As a result, the liquid crystal molecules LC are behaved (vibrated) in response to an electric field generated between the pixel electrode 12 and the common electrode 14. Then, flows responding to the vibration of the liquid crystal molecules LC are caused in the oblique deposition directions of the alignment films 62 and 63 in the vicinities of the interfaces between the alignment film 62 on the TFT substrate side and the alignment film 63 on the counter substrate side, and the liquid crystal layer 70.

Here, if the ionic impurities IP having the positive polarity, or the ionic impurities IN having the negative polarity are contained in the liquid crystal layer 70, then, the ionic impurities IP or IN are moved toward the specific portion of the effective pixel portion 21, for example, a corner portion along the flows caused by the liquid crystal molecules LC to stay in the corner portion in some cases. Then, when the ionic impurities IP or IN stay in the specific portion of the effective pixel portion 21, the retention rate of the liquid crystal is reduced, which is visually recognized in the form of the burn-in.

Embodiment of the Present Disclosure

The liquid crystal display device (active-matrix type liquid crystal display device) according to an embodiment of the present disclosure has been made for the purpose of realizing the display in which the amount of ionic impurities IP or IN in the liquid crystal layer 70 causing the burn-in is reduced in the effective pixel portion 21, and the burn-in is prevented from being visually recognized.

Specifically, in the active-matrix type liquid crystal display device according to the embodiment, in the dummy pixel portion 22 (refer to FIG. 2B) adjacent to the effective pixel portion 21, the ionic impurities IP or IN in the liquid crystal layer 70 which cause the burn-in are trapped in the alignment film 62, on the TFT substrate side, which is composed of the oblique deposition film and the alignment film 63, on the counter substrate side, which is composed of the oblique deposition film. As a result, the ionic impurities IP or IN in the effective pixel portion 21 can be more reliably discharged to the dummy pixel portion 22, and the burn-in in the effective pixel portion 21 can be reduced.

In the present embodiment, for the purpose of trapping the ionic impurities IP or IN in the liquid crystal layer 70 of the effective pixel portion 21 in the alignment films (oblique deposition films) 62 and 63 of the dummy pixel portion 22, firstly, the drive of each of the dummy pixels of the dummy pixel portion 22 having the same circuit configuration as that of each of the effective pixels of the effective pixel portion 21 is made the same as that in case of each of the effective pixels of the effective pixel portion 21. Specifically, a pixel electric potential which is written by the thin film transistor 11 is reversely driven with respect to the common voltage $V_{COM}$ (refer to FIG. 2A) applied to the common electrode 14 for both the effective pixel and the dummy pixel. The same drive (that is, the reverse drive) for the effective pixel and the dummy pixel is carried out under the drive by the pixel drive portion including the vertical drive portions 30A and 30B, the horizontal drive portion 40, and the like.

Here, in the active-matrix type liquid crystal display device, when the light is made incident to the pixel, the leakage (light leakage) occurs in the thin film transistor 11 as the pixel transistor. The setting of the common voltage $V_{COM}$ is carried out every display panel 60 in such a way that in the reverse drive, the effective pixel electric potential on a High side, and the effective pixel electric potential on a Low side become approximately equal to each other with respect to the common voltage $V_{COM}$ on the basis of the light leakage. Therefore, when the symmetry of the retention characteristics of the pixel electric potential in relation to the common voltage $V_{COM}$ is broken, a DC voltage component is generated in the liquid crystal layer 70. Hereinafter, the DC voltage component will be referred to as a residual DC. Since the common voltage $V_{COM}$ is set in response to the light leakage in the effective pixel portion 21, the residual DC is small in the effective pixel portion 21.

In the embodiment, in the reverse drive described above, the asymmetry of the retention characteristics of the pixel electric potential in relation to the common voltage $V_{COM}$ is changed so as to be more remarkable in the dummy pixel portion 22 relative to the effective pixel portion 21. In other words, with respect to the retention characteristics of the pixel electric potential in relation to the common voltage $V_{COM}$, the retention characteristics of the dummy pixel portion 22 is made asymmetrical relative to the retention characteristics of the effective pixel portion 21. At this time, the balance between High/Low of the pixel electric potential is ignored.

The asymmetry with respect to the common voltage $V_{COM}$ becomes remarkable in the dummy pixel portion 22. That is, the retention characteristics of the pixel electric potential becomes more asymmetrical in the dummy pixel portion 22 than in the effective pixel portion 21. As a result, the generation of the residual DC of the dummy pixel portion 22 becomes remarkable relative to the generation of the residual DC of the effective pixel portion 21. Then, by the operation of the residual DC of the dummy pixel portion 22 which is larger than the residual DC of the effective pixel portion 21, the ionic impurities IP and IN in the liquid crystal layer 70 of the effective pixel portion 21 are trapped in the alignment films (oblique deposition films) 62 and 63 of the dummy pixel portion 22.

Figure 4:
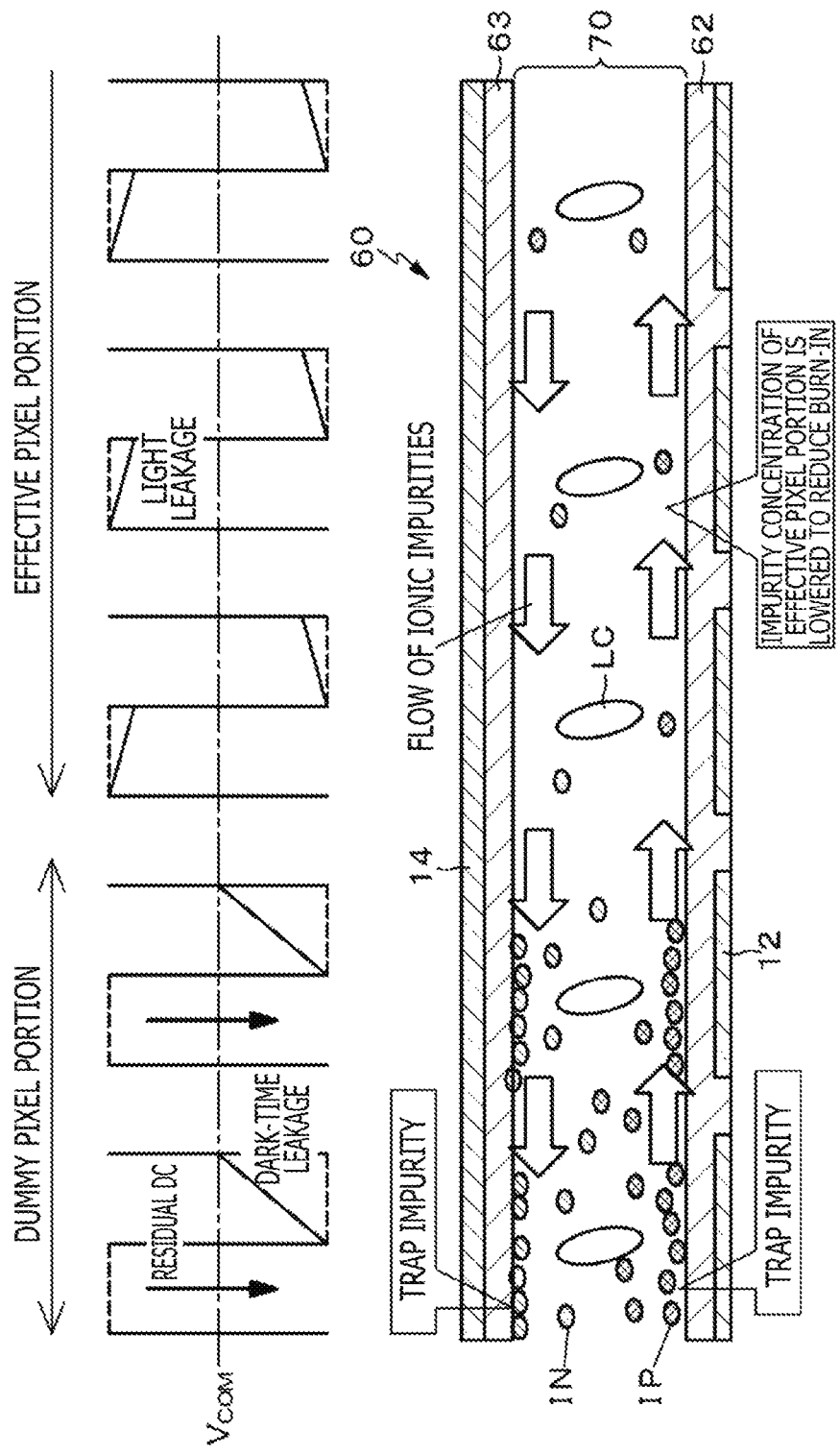
FIG. 4 is an explanatory view regarding residual DC of an effective pixel portion and a dummy pixel portion, and trap of the ionic impurities carried out by an operation of the residual DC in the dummy pixel portion.

As described above, with respect to the retention characteristics of the pixel electric potential relative to the common voltage $V_{COM}$, the retention characteristics of the dummy pixel portion 22 is made more asymmetrical (that is, the asymmetry is more remarkable) than the retention characteristics of the effective pixel portion 21 in such a way that the residual DC of the dummy pixel portion 22 becomes larger than the residual DC of the effective pixel portion 21. Then, by the operation of the residual DC of the dummy pixel portion 22, as depicted in FIG. 4, in the dummy portion 22, the ionic impurities IP and IN existing in the liquid crystal layer 70 of the effective pixel portion 21 can be trapped in the alignment films 62 and 63 each of which is composed of the oblique deposition film.

In particular, in the embodiment, the drive for each of the dummy pixels of the dummy pixel portion 22, having the same circuit configuration as that of each of the effective pixels of the effective pixel portion 21 is made the same as the drive (reverse drive) for each of the effective pixels of the effective pixel portion 21. Therefore, the flows of the ionic impurities IP and IN can be made uniform between the effective pixel portion 21 and the dummy pixel portion 22. As a result, since a barrier against the intrusion of the ionic impurities IP and IN existing in the liquid crystal layer 70 of the effective pixel portion 21 into the dummy pixel portion 22 can be lowered, the trap efficiency can be enhanced.

Incidentally, the ionic impurities IP and IN, as previously described, are moved toward the corner portion (a portion indicated by a circle X in FIG. 5A) of the effective pixel portion 21 along the flows caused by the liquid crystal molecules LC. At this time, if the flows of the ionic impurities IP and IN are not uniform between the effective pixel portion 21 and the dummy pixel portion 22, then, the ionic impurities IP and IN shall stay in a boundary portion between the effective pixel portion 21 and the dummy pixel portion 22.

Figure 5A:
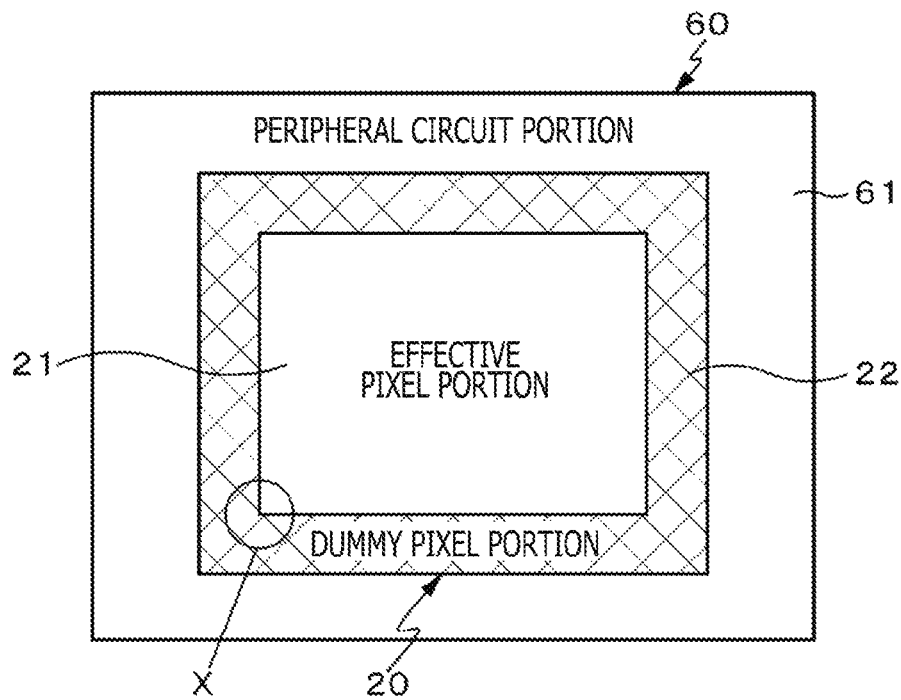
FIG. 5A is a top plan view depicting an example of a place where the ionic impurities are unevenly distributed when the ionic impurities are moved along the flow of the liquid crystal molecules.
Figure 5B:
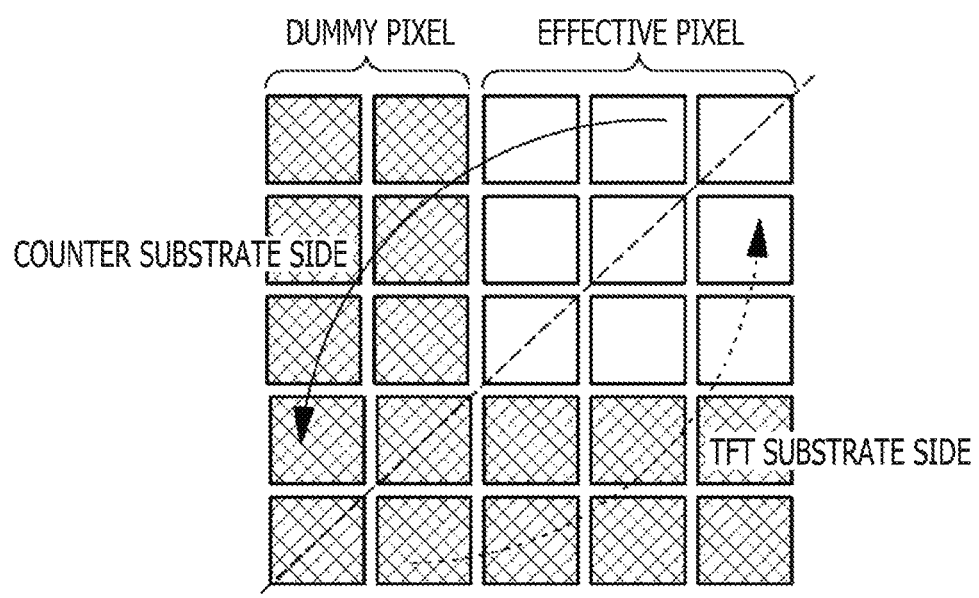
FIG. 5B is an enlarged view depicting a flow of the ionic impurities in a portion indicated by an circle X of FIG. 5A.

On the other hand, according to the embodiment, since the barrier against the intrusion into the dummy pixel portion 22 can be lowered, as depicted in FIG. 5B, the ionic impurities IP and IN in the effective pixel portion 21 can be more reliably discharged to the dummy pixel portion 22. In FIG. 5B in which the flows of the ionic impurities IP and IN in the portion indicated by the circle X of FIG. 5A is depicted in an enlargement manner, an arrow mark of a solid line indicates the flow of the ionic impurities IP and IN on the counter substrate side, and an arrow mark of a dotted line indicates the flow of the ionic impurities IP and IN on the TFT substrate side. In this case, however, these flows may be both reverse directions.

Moreover, in the embodiment, the drive for each of the dummy pixels of the dummy pixel portion 22, having the same circuit configuration as that of each of the effective pixels of the effective pixel portion 21 is made the same as the drive (reverse drive) for each of the effective pixels of the effective pixel portion 21. Therefore, a dedicated drive circuit for driving the dummy pixels of the dummy pixel portion 22 is unnecessary. As a result, there is a merit that a burden imposed on a driver IC or the like including the pixel drive portion is reduced.

Hereinafter, a description will be given with respect to concrete Examples. The concrete Examples aim at, with respect to the retention characteristics of the pixel electric potential for the common voltage $V_{COM}$, making the retention characteristics of the dummy pixel portion 22 more asymmetrical (making the asymmetry more remarkable) relative to the retention characteristics of the effective pixel portion 21, that is, making the residual DC of the dummy pixel portion 22 larger than the residual DC of the effective pixel portion 21.

Example 1 to Example 4 which will be described below are each an example in which in making the residual DC of the dummy pixel portion 22 larger than the residual DC of the effective pixel portion 21, the characteristics of the thin film transistor 11 to write the pixel electric potential are made different between the effective pixel in the effective pixel portion 21 and the dummy pixel in the dummy pixel portion 22.

Figure 6A:
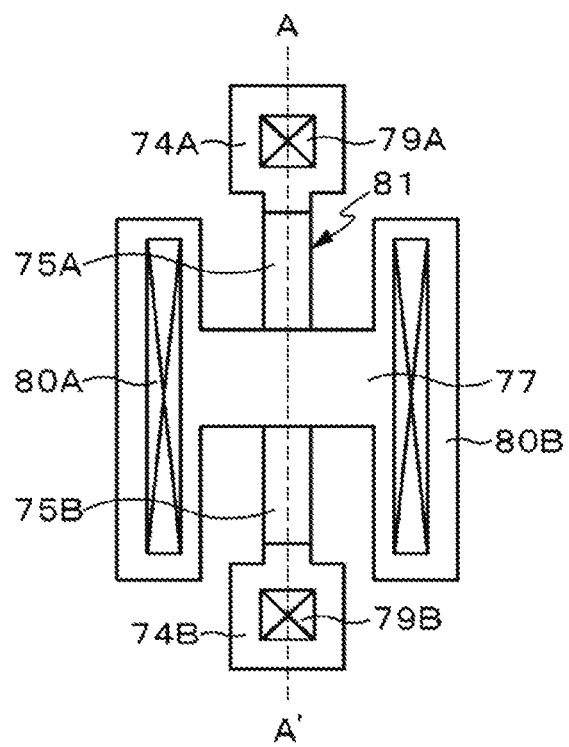
FIG. 6A is a top plan view of a thin film transistor in an effective pixel.
Figure 6B:
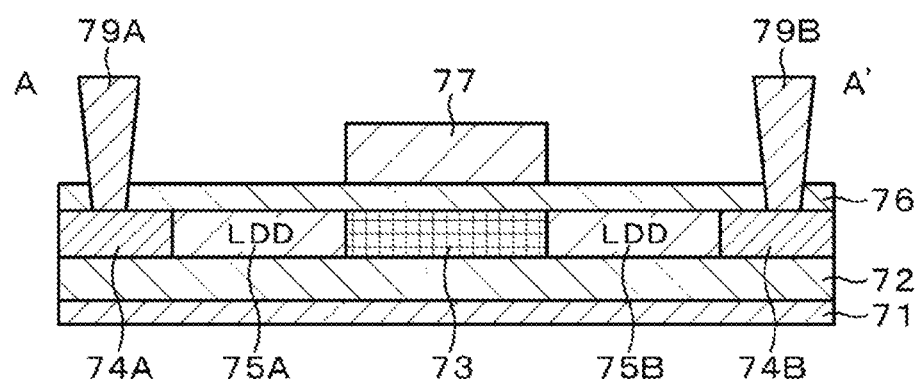
FIG. 6B is a cross-sectional view taken on line A-A' of FIG. 6A.

Firstly, a description will now be given with respect to a structure of the thin film transistor 11 of the effective pixel in the effective pixel portion 21. FIG. 6A depicts a top plan view of the thin film transistor 11 of the effective pixel, and FIG. 6B is a cross-sectional view taken on line A-A' of FIG. 6A. In the thin film transistor 11 of the effective pixel, a gate line (bottom gate) 71 is provided in the lowermost layer, and a gate insulating film 72 is provided as an upper layer of the gate line 71. A channel region 73 is formed at a central portion in the upper layer of the gate insulating film 72. One 74A side of the source/drain regions is formed at one end of the channel region 73, and the other 74B side of the source/drain regions is formed at the other end of the channel region 73. In addition, on the gate insulating film 72, an LDD (Lightly Doped Drain; low-concentrated impurity drain) region 75A is formed between one 74A side of the source/drain regions and the channel region 73, and an LDD region 75B is formed between the other 74B side of the source/drain regions and the channel region 73.

A gate insulating film 76 is formed on a layer including the channel region 73, the source/drain regions 74A and 74B, and the LDD regions 75A and 75B. It should be noted that illustration of the gate insulating film 76 is omitted in FIG. 6B. A gate electrode (top gate) 77 is formed on the gate insulating film 76 so as to be opposite to the channel region 73. In addition, the source/drain regions 74A and 74B are electrically connected through contact portions 79A and 79B.

In the thin film transistor 11 in the effective pixel having the structure described above, as depicted in FIG. 6A, contact portions 80A and 80B for the gate electrode 77 and the gate line 71 are formed in the vicinities of the LDD regions 75A and 75B so as to serve as the light blocking as well along a gate length direction (along a vertical direction in FIG. 6A).

As apparent from FIG. 6A and FIG. 6B, in the thin film transistor 11 in the effective pixel, the lengths of the LDD regions 75A and 75B, and the thickness of the gate insulating film 76 are symmetrical between one 74A side of the source/drain regions, and the other 74B side of the source/drain regions. The concentrations of the LDD regions 75A and 75B are also symmetrical between one 74A side of the source/drain regions, and the other 74B side of the source/drain regions. In addition, distances between the LDD regions 75A and 75B, and the contact portions 80A and 80B are symmetrical between one 74A side of the source/drain regions, and the other 74B side of the source/drain regions.

EXAMPLE 1

Figure 7A:
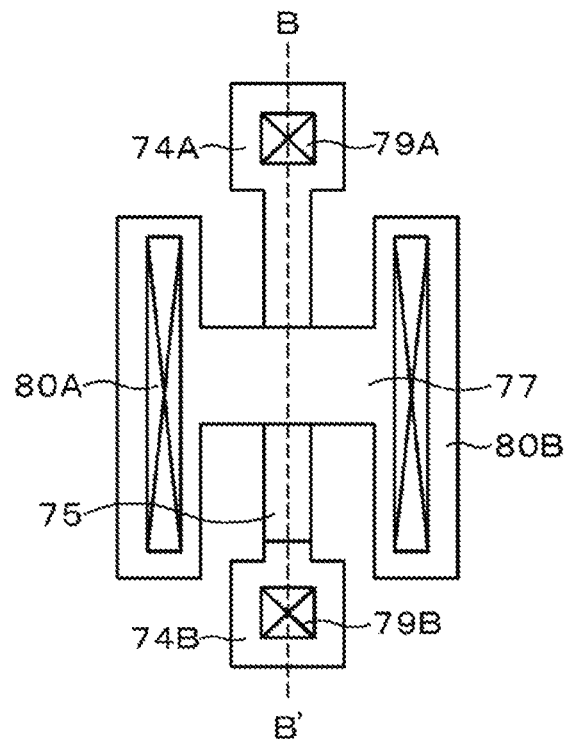
FIG. 7A is a top plan view of a thin film transistor in a dummy pixel according to Example 1.
Figure 7B:
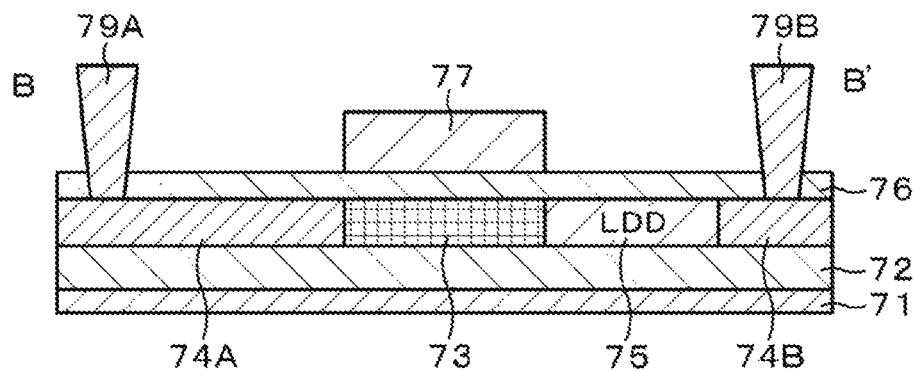
FIG. 7B is a cross-sectional view taken on line B-B' of FIG. 7A.

Example 1 is an example in which in the thin film transistor 11 of the dummy pixel having the LDD regions 75A and 75B, the lengths (LDD lengths) of the LDD regions 75A and 75B are made asymmetrical between one 74A side of the source/drain regions and the other 74B side of the source/drain regions. It should be noted that even in the thin film transistor 11 of the effective pixel, the LDD lengths or the like may be made asymmetrical between one 74A side of the source/drain regions and the other 74B side of the source/drain regions. In this case, it is only necessary that the thin film transistor 11 of the dummy pixel is more remarkable in asymmetry thereof than the thin film transistor 11 of the effective pixel. FIG. 7A depicts a top plan view of the thin film transistor 11 of the dummy pixel according to Example 1, and FIG. 7B depicts a cross-sectional view taken on line B-B' of FIG. 7A.

The thin film transistor 11 of the dummy pixel according to Example 1 adopts a structure in which the LDD region 75 on one 74A side of the source/drain regions is omitted, and the LDD region 75 on only the other 74B side of the source/drain regions is provided. That is, there is adopted a structure in which the LDD lengths are asymmetrical between the one 74A side of the source/drain regions and the other 74B side of the source/drain regions. As a result, the characteristics of the thin film transistor 11 of the dummy pixel can be made different from the characteristics of the thin film transistor 11 of the effective pixel.

No light is made incident to the dummy pixel portion 22 because the light blocking is carried out. In the thin film transistor 11 of the dummy pixel, a leakage current between a source and a drain is determined by electric field strength of a PN junction in a connection portion between the channel region 73 and the LDD region 75. For the purpose of reducing the electric field strength, in general, the LDD region 75 is formed. Then, in the thin film transistor 11 of the dummy pixel, the length of the LDD region 75 is designed so as to be asymmetrical between one 74A side of the source/drain regions and the other 74B side of the source/drain regions, thereby enabling the retention characteristics of the pixel electric potential with respect to the common voltage $V_{COM}$ to be made asymmetrical.

It should be noted that although, in the present example, one 74A side of the source/drain regions is omitted in the LDD regions 75, whereby the lengths of the LDD regions 75 are made asymmetrical between one 74A side of the source/drain regions and the other 74B side of the source/drain regions, the present disclosure is by no means limited to this structure. Specifically, even when with respect to the length of each of the LDD regions 75, the other 74B side of the source/drain region is omitted, and the retention characteristics of the pixel electric potential with respect to the common voltage $V_{COM}$ can be made asymmetrical.

In addition, even when the lengths of the LDD regions 75A and 75B are made different between one 74A side of the source/drain regions and the other 74B side of the source/drain regions, for example, made different by 0.5 µm or more between them, the retention characteristics of the pixel electric potential with respect to the common voltage $V_{COM}$ can also be made asymmetrical. The numerical value exemplified here is an approximate value with which the difference is offered in terms of the device characteristics. However, even in case of the numerical value or less described above, the difference is caused in terms of the device characteristics depending on the device design.

Manufacturing Method

Figure 8:
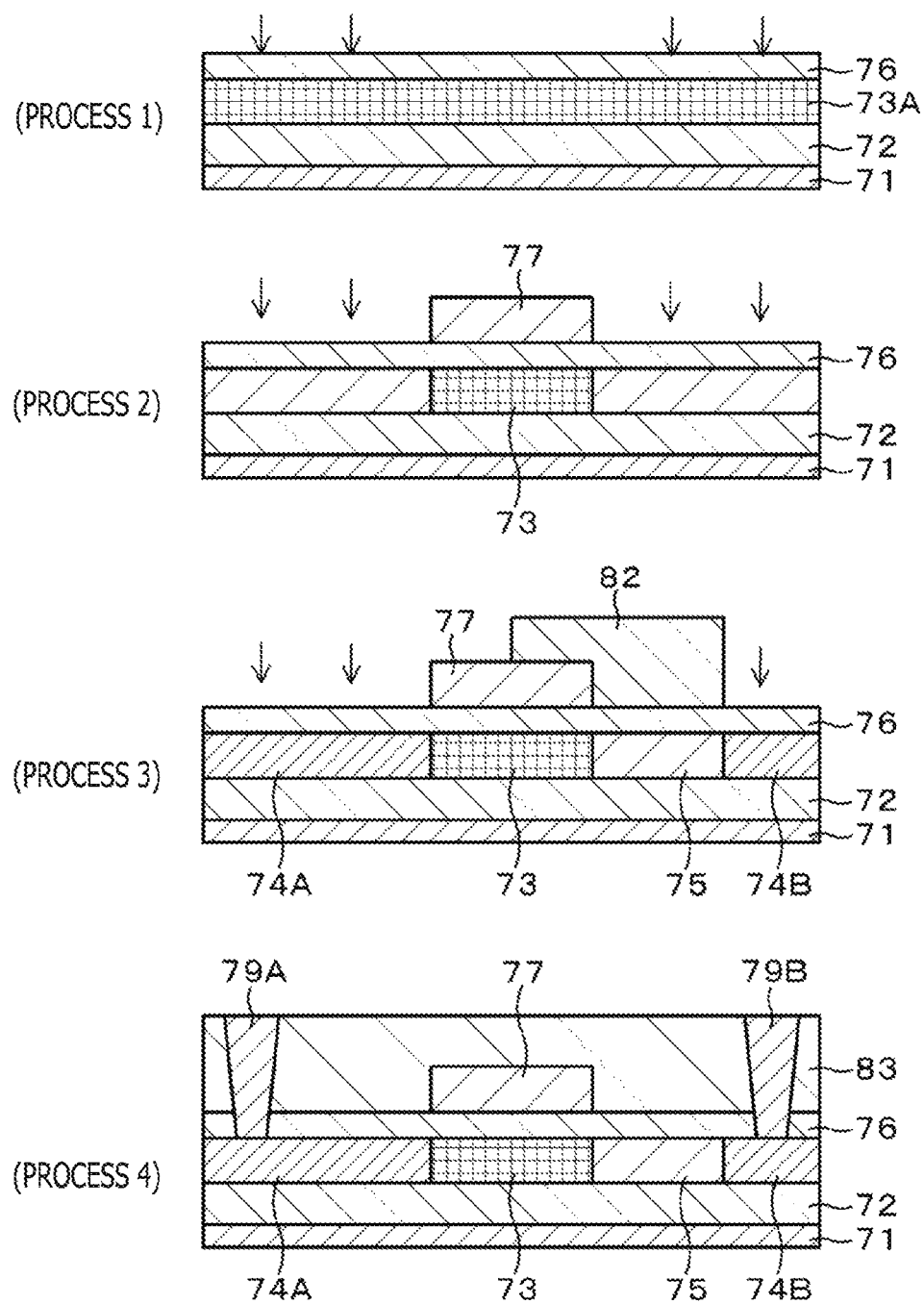
FIG. 8 is a process chart depicting a procedure of a method of manufacturing the thin film transistor in the dummy pixel according to Example 1.

Next, a description will be given with respect to a method of manufacturing the thin film transistor 11 of the dummy pixel according to Example 1 with reference to a process chart of FIG. 8.

In a process 1, up to a gate line (bottom gate) 71, a gate insulating film 72 on the bottom gate side, a semiconductor layer 73A becoming a channel region 73, and a gate insulating film 76 on the top gate side are formed, and ion implantation for the channel region 73 is carried out. In a process 2, contact portions 80A and 80B (refer to FIG. 7A) for the gate line 71, and the gate electrode (top gate) 77 are formed, and ion implantation for the LDD region 75 is carried out in a self-alignment manner with the gate electrode 77 as a mask.

Next, in a process 3, for example, a resist film 82 is formed so as to cover only the LDD formation region on the other 74B side of the source/drain regions. Then, the ion implantation is carried out with the gate electrode 77 and the resist film 82 as a mask to form the source/drain regions 74A and 74B. In a process 4, formation of an interlayer film 83, activation annealing, and formation of the contact portions 79A and 79B for the source/drain regions 74A and 74B are carried out. Hereinafter, a wiring process will be carried out.

In this manufacturing method, as to the LDD region 75, the case where the one 74A side of the source/drain regions is omitted has been described by giving an example. However, even in the case where the other 74B side of the source/drain regions is omitted, or even in the case where the LDD lengths are changed, in the process 3, the formation position of the resist film 82 can be changed, thereby coping with these cases.

EXAMPLE 2

Example 2 is a modified change of Example 1. This modified change is an example in which in the thin film transistor 11 of the dummy pixel having the LDD regions 75A and 75B, concentrations of the LDD regions 75A and 75B are made asymmetrical between the one 74A side of the source/drain regions and the other 74B side of the source/drain regions.

In the thin film transistor 11 of the dummy pixel according to Example 2, the concentration of the LDD region 75A on one 74A side of the source/drain regions, and the concentration of the LDD region 75B on the other 74B side of the source/drain regions are made different from each other. More specifically, the impurity concentration of the LDD region 75A on one 74A side of the source/drain regions is relatively thickened, and the impurity concentration of the LDD region 75B on the other 74B side of the source/drain regions is relatively reduced. In this case, a difference between them, for example, is set to twice or more. As a result, similarly to the case of Example 1 in which the LDD lengths are made asymmetrical, the characteristics of the thin film transistor 11 of the dummy pixel can be made different from the characteristics of the thin film transistor 11 of the effective pixel.

It should be noted that in the present example, the impurity concentration of the LDD region 75A on one 74A side of the source/drain regions is relatively thickened, and the impurity concentration of the LDD region 75B on the other 74B side of the source/drain regions is relatively reduced, or vice versa. In addition, the numerical value exemplified here is an approximate value with which the difference is offered in terms of the device characteristics. However, even in case of the numerical value or less described above, the difference is caused in terms of the device characteristics depending on the device design.

Manufacturing Method

Next, a description will be given with respect to a method of manufacturing the thin film transistor 11 of the dummy pixel according to Example 2 with reference to a process chart of FIG. 9.

In this case, for simplicity of the description, the processing corresponding to that in the process 1 of Example 1, and the processing corresponding to that in the process 2 of Example 1 are omitted. The processing corresponding to the process 1 of Example 1 is the processing for forming up to the gate line 71, the gate insulating film 72, the semiconductor layer 73A becoming the channel region 73, and the gate insulating film 76, and carrying out the ion implantation for the channel region 73. The processing corresponding to that in the process 2 of Example 1 is the processing corresponding to that in the process 2 of Example 1, that is, the processing for forming the contact portions 80A and 80B for the gate line 71, and the gate electrode 77, and carrying out the ion implantation for the LDD region 75B in the self-alignment manner with the gate electrode 77 as the mask.

Figure 9:
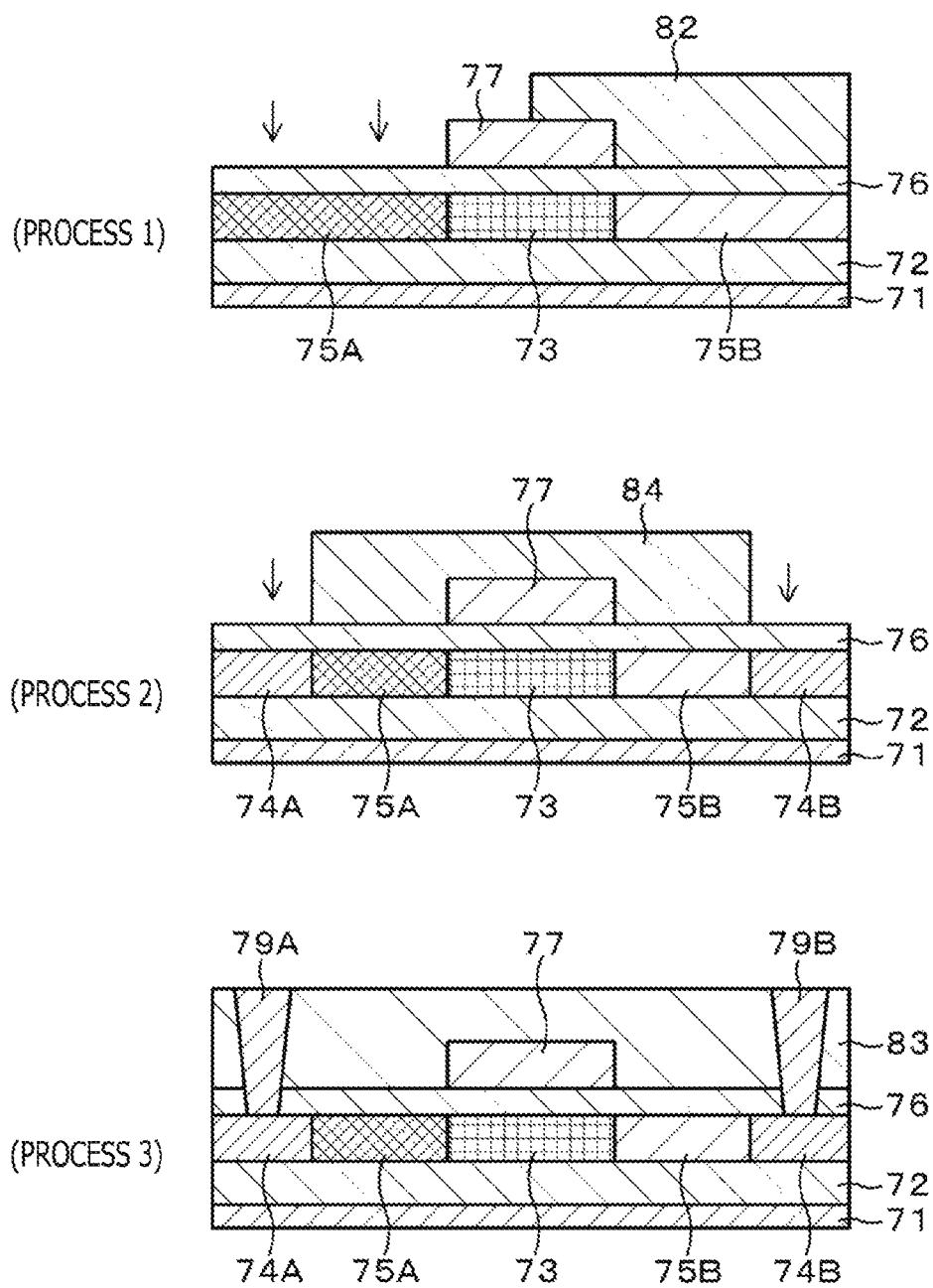
FIG. 9 is a process chart depicting a procedure of a method of manufacturing a thin film transistor in a dummy pixel according to Example 2.

In FIG. 9, in a process 1, the resist film 82 is formed so as to cover the gate electrode 77 and the LDD region 75B, and ion implantation for the LDD region 75A is carried out with the gate electrode 77 and the resist film 82 as a mask. Here, the impurity concentration of the LDD region 75A is set as being relatively dense, and the impurity concentration of the LDD region 75B is set as being relatively weak.

Next, in a process 2, a resist film 84 is formed so as to cover the gate electrode 77 and the LDD regions 75A and 75B, and the ion implantation is carried out with the resist film 83 as a mask, thereby forming the source/drain regions 74A and 74B. In a process 3, there are carried out the formation of the interlayer film 83, the activation annealing, the formation of the contact portions 79A and 79B for the source/drain regions 74A and 74B, and the formation of the contact portions 80A and 80B (refer to FIG. 7A) for the gate electrode 77. Hereinafter, a wiring process will be carried out.

EXAMPLE 3

Figure 10A:
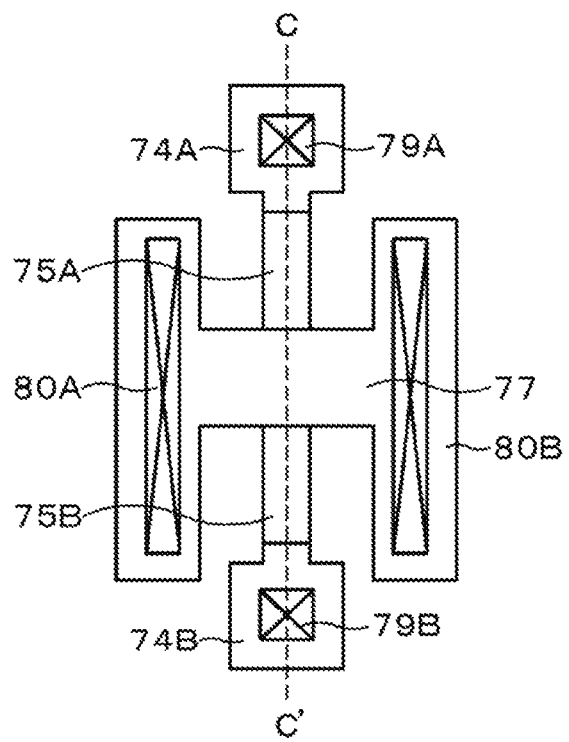
FIG. 10A is a top plan view of a thin film transistor of a dummy pixel according to Example 3.
Figure 10B:
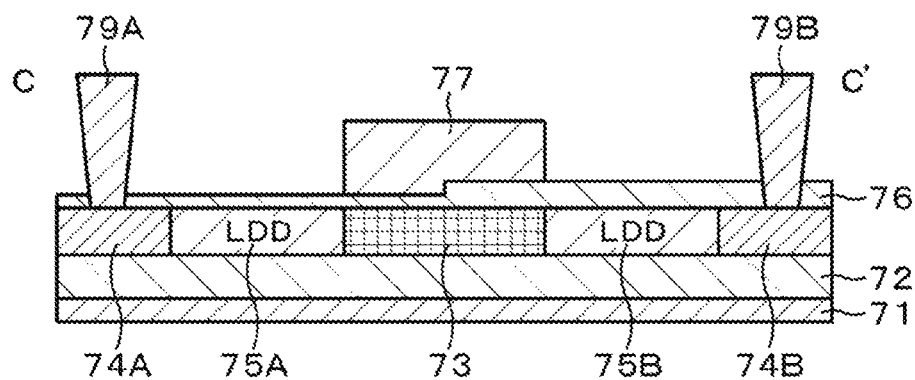
FIG. 10B is a cross-sectional view taken on line C-C' of FIG. 10A.

Example 3 is an example in which in the thin film transistor 11 of the dummy pixel, a thickness of the gate insulating film is made asymmetrical between one 74A side of the source/drain regions and the other 74B side of the source/drain regions. FIG. 10A depicts a top plan view of the thin film transistor 11 of the dummy pixel according to Example 3, and FIG. 10B depicts a cross-sectional view taken on line C-C' of FIG. 10A.

In the thin film transistor 11 of the dummy pixel according to Example 3, with respect to the gate insulating film 76 on the top gate side, a thickness on one 74A side of the source/drain regions, and a thickness on the other 74B side of the source/drain regions are different from each other. More specifically, the thickness of the gate insulating film 76 on one 74A side of the source/drain regions is made relatively thin, and thickness of the gate insulating film 76 on the other 74B side of the source/drain regions is made relatively thick. In this case, these thicknesses, for example, are made different by 10 nm or more from each other.

It is known as a GIDL (Gate Induced Drain Leakage) that in the pixel transistor, the source-to-drain leakage is influenced by an electric field as well from the gate electrode. As the gate insulating film 76 is thinner, the influence by the electric field from the gate electrode becomes large. Therefore, the thickness of the gate insulating film 76 is made asymmetrical between one 74A side of the source/drain regions and the other 74B side of the source/drain regions, thereby enabling the retention characteristics of the pixel electric potential for the common voltage $V_{COM}$ to be made asymmetrical.

It should be noted that in the present example, the thickness of the gate insulating film 76 on one 74A side of the source/drain regions is made relatively thin, and thickness of the gate insulating film 76 on the other 74B side of the source/drain regions is made relatively thick, or vice versa. The numerical value exemplified here is an approximate value with which the difference is offered in terms of the device characteristics. However, even in case of the numerical value or less described above, the difference is caused in terms of the device characteristics depending on the device design.

Manufacturing Method

Figure 11:
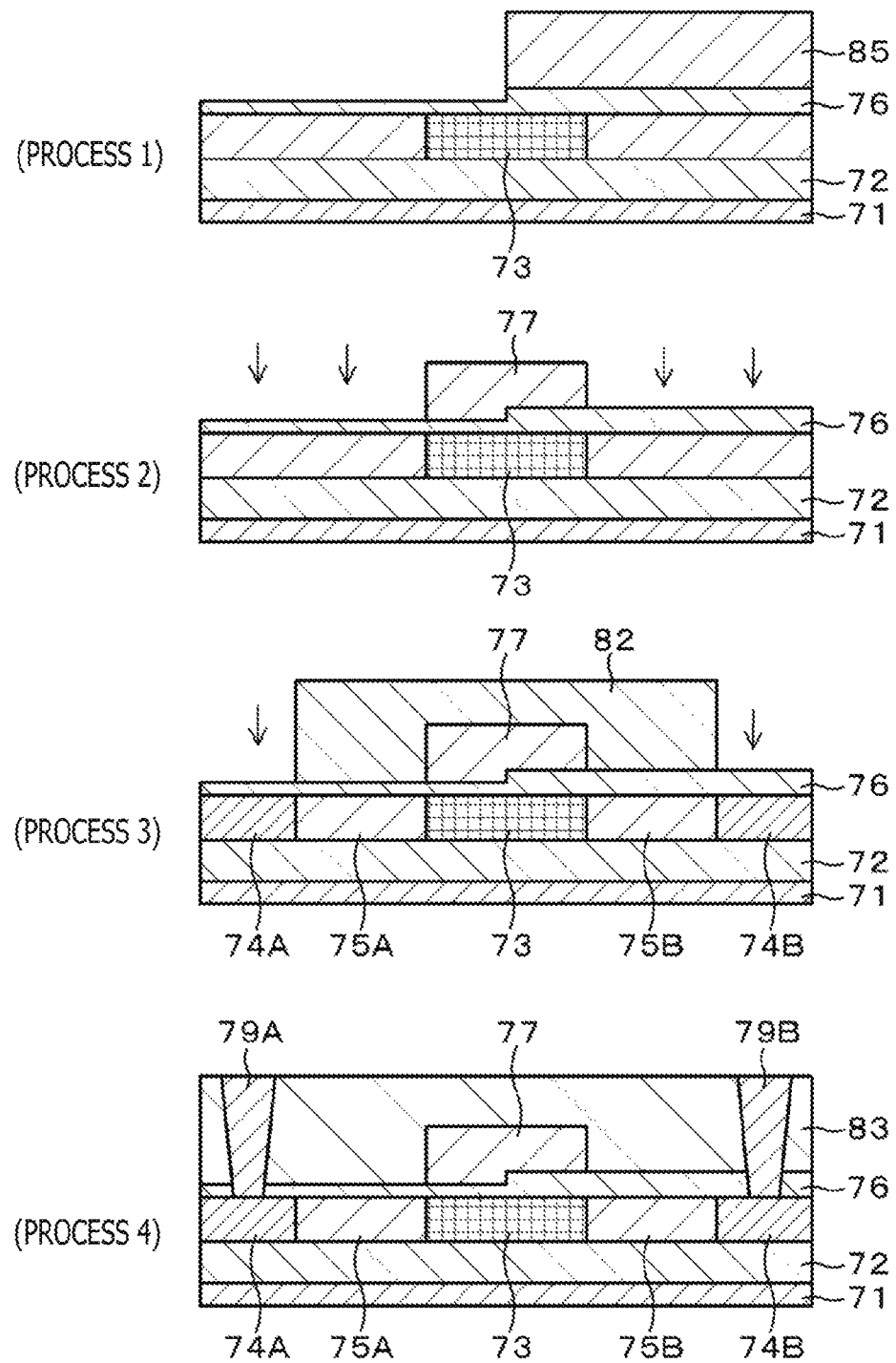
FIG. 11 is a process chart depicting a procedure of a method of manufacturing the thin film transistor in the dummy pixel according to Example 3.

Next, a description will be given with respect to a method of manufacturing the thin film transistor 11 of the dummy pixel according to Example 3 with reference to a process chart of FIG. 11. In this case, for simplicity of a description, the processing corresponding to that in the process 1 of Example 1, that is, the processing for forming up to the gate line 71, the gate insulating film 72, the semiconductor layer 73A becoming the channel region 73, and the gate insulating film 76, and carrying out the ion implantation for the channel region 73 is omitted here.

In a process 1, a resist film 85 is formed up to a position of a half of the gate insulating film 76 on the top gate side, and the gate insulating film 76 is processed with the resist film 85 as a mask. With respect to the processing, any type processing such as wet processing or dry processing may be adopted as long as it can etch the gate insulating film 76. In a process 2, the contact portions 80A and 80B, and the gate electrode (top gate) 77 for the gate line 71 are formed, and the ion implantation for the LDD regions 75A and 75B is carried out in the self-alignment manner with the gate electrode 77 as the mask.

Next, in a process 3, the resist film 82 is formed so as to cover the gate electrode 77 and the LDD regions 75A and 75B, and the ion implantation is carried out with the resist film 82 as the mask, thereby forming the source/drain regions 74A and 74B. In a process 4, there are carried out the formation of the interlayer film 83, the activation annealing, the formation of the contact portions 79A and 79B for the source/drain regions 74A and 74B, and the formation of the contact portions 80A and 80B (refer to FIG. 10A) for the gate electrode 77. Hereinafter, the wiring process will be carried out.

EXAMPLE 4

Figure 12:
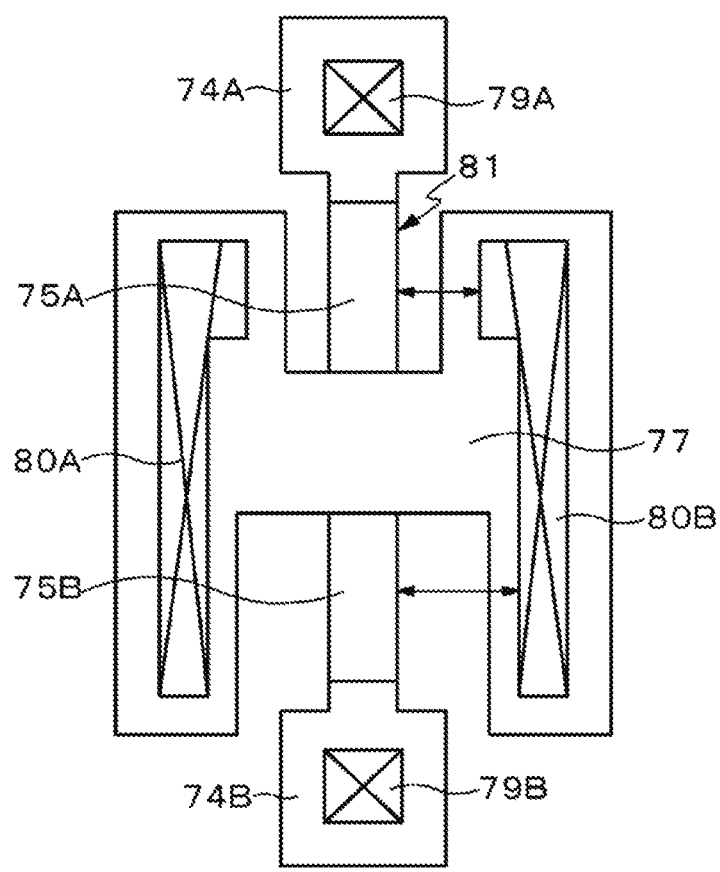
FIG. 12 is a top plan view of a thin film transistor in a dummy pixel according to Example 4.

Example 4 is an example in which in the thin film transistor 11 of the dummy pixel in which the contact portions 80A and 80B for the gate line 71 and the gate electrode 77 are formed along a gate length direction in the vicinities of the LDD regions 75A and 75B, distances between the LDD regions 75A and 75B, and the contact portions 80A and 80B are made asymmetrical between one 74A side of the source/drain regions and the other 74B side of the source/drain regions. FIG. 12 depicts a top plan view of the thin film transistor 11 of the dummy pixel according to Example 4.

In the thin film transistor 11 of the dummy pixel according to Example 4, the distance between the contact portion 80A and the LDD region 75A is made shorter by 0.2 μm or more than the distance between the contact portion 80B and the LDD region 75B, thereby providing the asymmetry between one 74A side of the source/drain regions and the other 74B side of the source/drain regions.

In the case where the contact portions 80A and 80B for the gate electrode 77 are formed along the gate length direction (in the vertical direction in FIG. 12) in the vicinities of the LDD regions 75A and 75B, each of the distances (plane distances) between the contact portions 80A and 80B, and the LDD regions 75A and 75B on the top plan view corresponds to a thickness of the gate insulating film 76 on the top gate side. Therefore, the distances between the LDD regions 75A and 75B, and the contact portions 80A and 80B are made asymmetrical between one 74A side of the source/drain regions and the other 74B side of the source/drain regions, thereby enabling the retention characteristics of the pixel electric potential for the common voltage $V_{COM}$ to be made asymmetrical.

It should be noted that in the present example, the distance between the contact portion 80A and the LDD region 75A is made shorter than the distance between the contact portion 80B and the LDD region 75B, or vice versa. The numerical value exemplified here is an approximate value with which the difference is caused in terms of the device characteristics. However, even in case of the numerical value or less described above, the difference is caused in terms of the device characteristics depending on the device design.

Manufacturing Method

Figure 13:
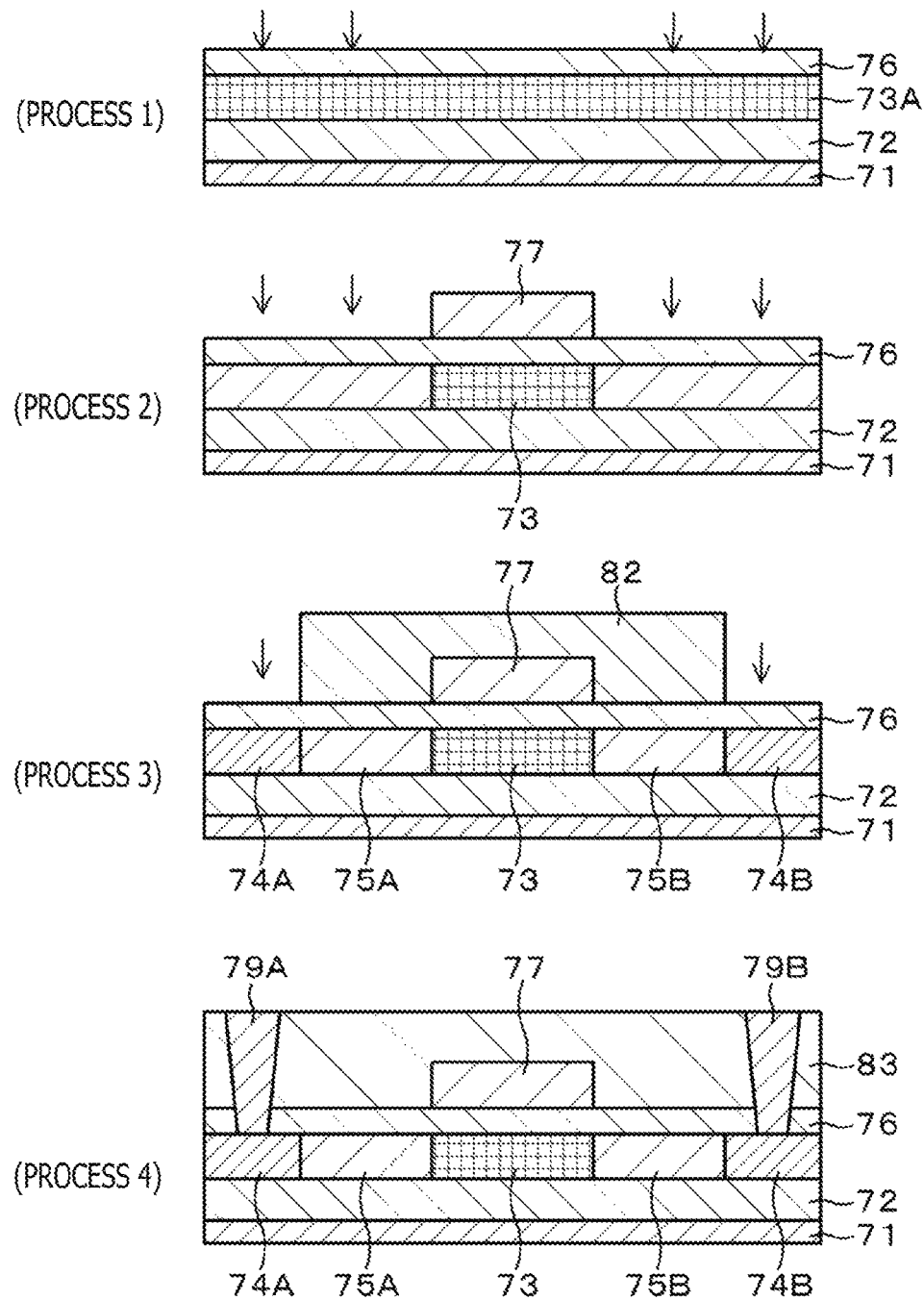
FIG. 13 is a process chart depicting a procedure of a method of manufacturing the thin film transistor in the dummy pixel according to Example 4.

Next, a description will be given with respect to a method of manufacturing the thin film transistor 11 of the dummy pixel according to Example 4 with reference to a process chart of FIG. 13.

In a process 1, up to the gate line (bottom gate) 71, the gate insulating film 72 on the bottom gate side, the semiconductor layer 73A becoming the channel region 73, and the gate insulating film 76 on the top gate side are formed, and the ion implantation for the channel region 73 is carried out. In a process 2, the contact portions 80A and 80B and the gate electrode (top gate) 77 for the gate line 71 are formed, and the ion implantation for the LDD regions 75A and 75B is carried out in the self-alignment manner with the gate electrode 77 as the mask.

Next, in a process 3, the resist film 82 is formed so as to cover the gate electrode 77 and the LDD regions 75A and 75B, and the ion implantation is carried out with the resist film 82 as a mask to form the source/drain regions 74A and 74B. In a process 4, there are carried out the formation of the interlayer film 83, the activation annealing, the formation of the contact portions 79A and 79B to the source/drain regions 74A and 74B, and the formation of the contact portions 80A and 80B (refer to FIG. 10A) for the gate electrode 77. Hereinafter, the wiring process will be carried out.

In the manufacturing method described above, a planar layout of the contact portions 80A and 80B for the gate line 71 and the gate electrode 77 is changed. As a result, distances between the LDD regions 75A and 75B and the contact portions 80A and 80B can be made asymmetrical between one 74A side of the source/drain regions and the other 74B side of the source/drain regions.

EXAMPLE 5

Figure 14A:
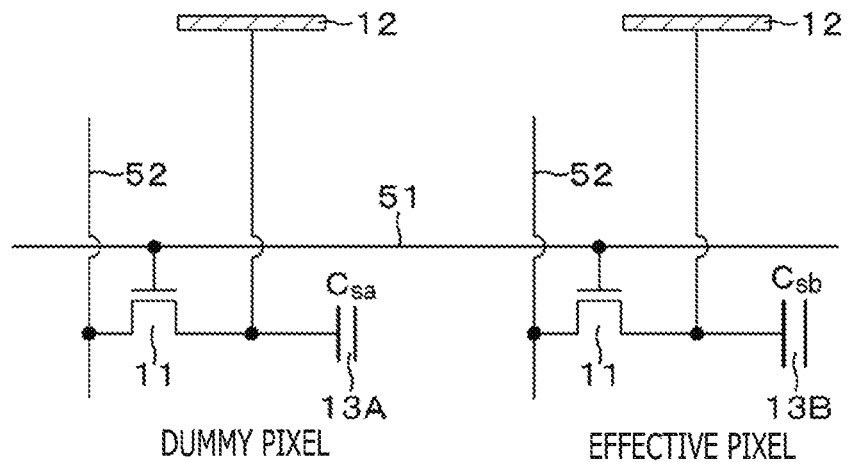
FIG. 14A is a circuit diagram of an effective pixel and a dummy pixel according to Example 5.
Figure 14B:
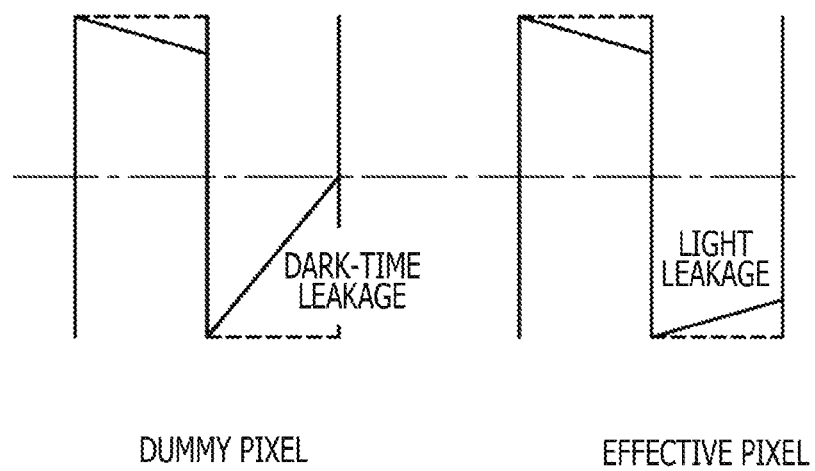
FIG. 14B is a waveform chart depicting a change of a pixel electric potential of the effective pixel, and a change of a pixel electric potential of the dummy pixel.

Example 5 is an example in which a capacitance value of the retention capacitor of the dummy pixel is set smaller than a capacitance value of the retention capacitor of the effective pixel, thereby making the retention characteristics of the pixel electric potential for the common voltage $V_{COM}$ to be the asymmetry. FIG. 14A depicts a circuit diagram of the effective pixel and the dummy pixel according to Example 5, and FIG. 14B depicts waveform charts of the pixel electric potential of the effective pixel and the dummy pixel. Here, the retention capacitor 13 of the dummy pixel is set as a retention capacitor 13A, and the retention capacitor 13 of the effective pixel is set as a retention capacitor 13B.

The effective pixel and the dummy pixel according to Example 5 have a configuration in which a capacitance value Csa of the retention capacitor 13A of the dummy pixel is set smaller than a capacitance value Csb of the retention capacitor 13B of the effective pixel. With respect to a capacitance value Cs of the retention capacitor 13, the capacitance value Cs can be changed by changing an electrode area of the retention capacitor 13, a film thickness (electrode-to-electrode distance) of a dielectric film, and a kind of film of the dielectric film. In FIGS. 14A and 14B, a difference in capacitance value Cs of the retention capacitor 13 is schematically represented by a size of the symbol of the retention capacitor 13.

In such a manner, the capacitance value $C_{sa}$ of the retention capacitor 13A of the dummy pixel, and the capacitance value $C_{sb}$ of the retention capacitor 13B of the effective pixel are made different from each other, thereby enabling how to reduce the pixel electric potential to be changed even in the same leakage current in terms of the thin film transistor 11. Specifically, the capacitance value $C_{sa}$ of the retention capacitor 13A of the dummy pixel is made smaller than the capacitance value $C_{sb}$ of the retention capacitor 13B of the effective pixel, whereby as depicted in FIG. 14B, dark-time leakage (leakage in a light blocking state) of the dummy pixel becomes larger in degree of reduction than light leakage (leakage at the time of light irradiation) of the effective pixel. As a result, with regard to the retention characteristics of the pixel electric potential in relation to the common voltage $V_{COM}$, the retention characteristics of the dummy pixel portion 22 can be asymmetrical (that is, the asymmetry is made remarkable) relative to the retention characteristics of the effective pixel portion 21.

Manufacturing Method

Next, a description will be given with respect to a method of manufacturing the retention capacitors of the effective pixel and the dummy pixel according to Example 5 with reference to a process chart of FIG. 15.

In the related art, with respect to the retention capacitors of the effective pixel and the dummy pixel, a lower electrode 91, a dielectric 92, and an upper electrode 93 are formed in order over the entire pixel array portion 20 irrespective of the effective pixel portion 21 and the dummy pixel portion 22. The lower electrode 91 and the upper electrode 93 may be made of the same material, or different materials.

Subsequently, a description will be given with respect to a method of manufacturing the retention capacitor according to Example 5. In a process 1, the lower electrode 91 and a first dielectric 92 are formed, and thereafter, only the dummy pixel portion 22 is covered with the resist film 84, and the first dielectric 92 in the effective pixel portion 22 is removed away. In a process 2, a second dielectric 95 is formed. The second dielectric 95 may be made of the same material as that of the first dielectric 92 or may be made of a material different from that of the first dielectric 92. In a process 3, the upper electrode 93 is formed. Similarly to the related art, the lower electrode 91 and the upper electrode 93 may be made of the same material, or may be made of different materials.

It should be noted that although in the present example, a description has been given with respect to the case where the film thickness (the distance between the lower electrode 91 and the upper electrode 93) of the dielectric is changed as an example, in the case where the electrode area is changed, the processes become the same as those in the related art. In this case, however, the planar layout shall be changed.

Electronic Apparatus of the Present Disclosure

The liquid crystal display device of the present disclosure which has been described so far can be used as a display portion (display device), of the electronic apparatus in all the fields, in which a video signal inputted to the electronic apparatus, or a video signal produced in the electronic apparatus is displayed in the form of an image or a video. As an example, the liquid crystal display device can be used as the display portion of a television set, a projection display device (projector), a digital still camera, a notebook type personal computer, a mobile terminal apparatus such as a mobile phone, a video camera, and the like.

The liquid crystal display device of the present disclosure also includes a module-shaped one having an enclosed configuration. As an example, a display module which is formed by sticking a counter portion such as a transparent glass to the pixel array portion corresponds thereto. It should be noted that the display module may be provided with a circuit portion for inputting/outputting a signal or the like from the outside to the pixel array portion, a flexible printed circuit (FPC), and the like. Hereinafter, a projection display device (projector) will be exemplified as a concrete example of the electronic apparatus using the liquid crystal display device of the present disclosure. However, the concrete example exemplified here is merely an example, and the present disclosure is by no means limited thereto.

Projection Display Device

Figure 16:
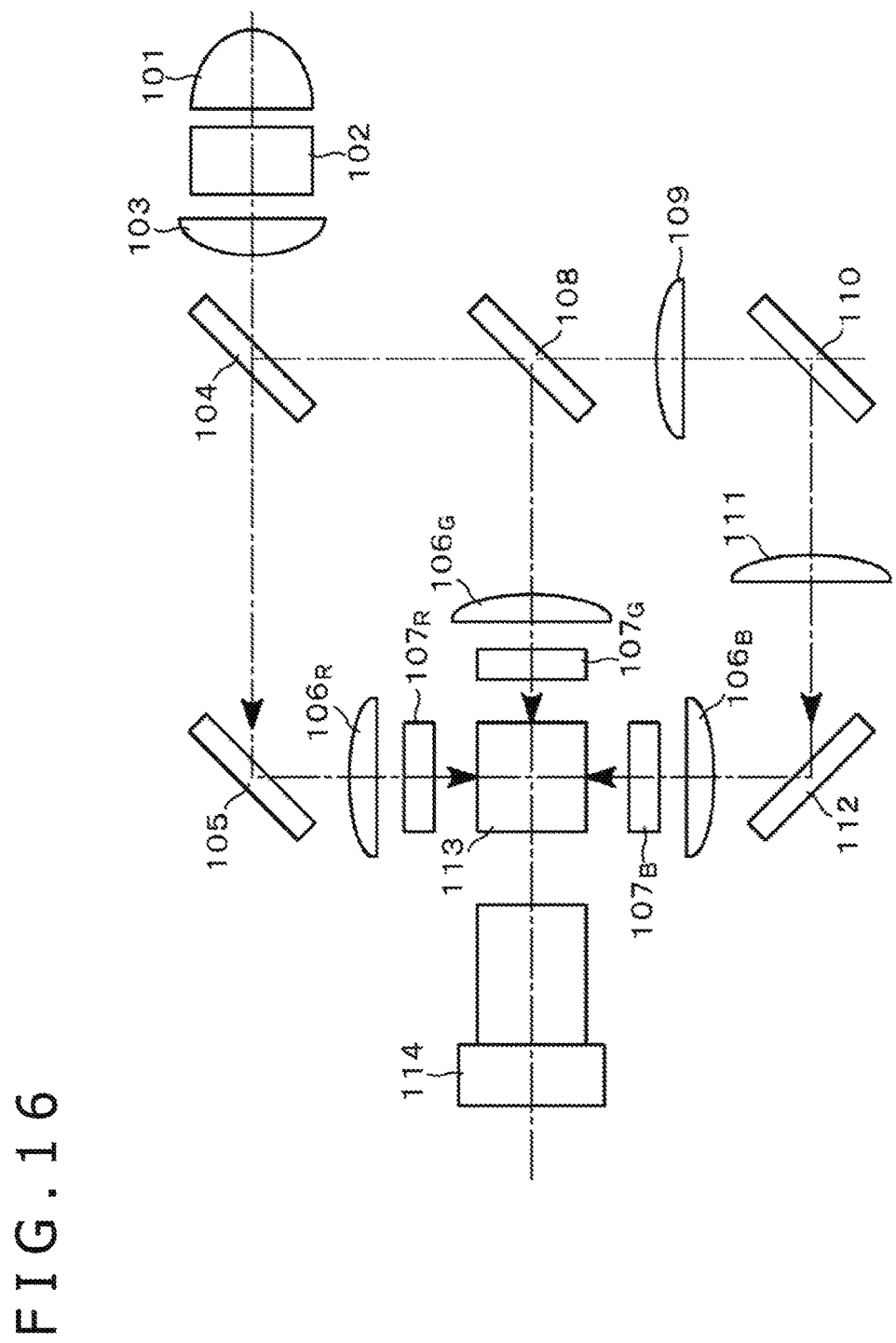
FIG. 16 is a view depicting a schematic configuration of an optical system of a three-plate type projection display device using the liquid crystal display device (liquid crystal panel) of the present disclosure.

FIG. 16 is a view depicting a schematic configuration of an optical system, for example, of a three-plate type projection display device using the liquid crystal display device (liquid crystal panel) of the present disclosure.

In FIG. 16, after white light emitted from a light source 101 such as a white lamp is converted from P-polarized light to S-polarized light in a polarization conversion element 102, the illumination is uniformized in a fly-eye lens 103 to be made incident to a dichroic mirror 104. Then, only a specific color component, for example, an R (red color) light component is transmitted through the dichroic mirror 104, and remaining color light components are reflected by the dichroic mirror 104. After the R light component transmitted through the dichroic mirror 104 is changed in optical path thereof by a mirror 105, the R light component is made incident to a liquid crystal panel 107R through a lens 106R.

With respect to the light components reflected by the dichroic mirror 104, for example, a G (green color) light component is reflected by the dichroic mirror 108, and a B (blue color) is transmitted through the dichroic mirror 108. The G light component reflected by the dichroic mirror 108 is made incident to a G liquid crystal panel 107G through a lens 106G. After the B light component transmitted through the dichroic mirror 108 is transmitted through a lens 109, the B light component is changed in optical path thereof by a mirror 110. Moreover, after the B light component is transmitted through a lens 111, the B light component is changed in optical path thereof by a mirror 112, and is made incident to a B liquid crystal panel 107B through a lens 106B.

It should be noted that although not depicted in FIG. 16, polarizing plates are arranged on the incidence sides and on the emission sides of the liquid crystal panels 107R, 107G and 107B. As well known, a pair of polarizing plates on the incidence side and on the emission side is installed in such a way that the polarizing directions thereof become vertical to each other (cross Nicol), thereby enabling a normally white mode to be set. In addition, a pair of polarizing plates on the incidence side and on the emission side is installed in such a way that the polarizing directions thereof become parallel to each other (parallel Nicol), thereby enabling a normally black mode to be set.

The R, G and B light components which are passed through the liquid crystal panels 107R, 107G and 107B, respectively, are synthesized in the dichroic prism 113. Then, the resulting light obtained through the synthesis in the dichroic prism 113 is made incident to a projection lens 114 to be projected on a screen (not depicted) by the projection lens 114.

In the three-plate type projection display device having the configuration described above, any of the liquid crystal display devices (liquid crystal panels) according to Example 1 to Example 5 described above can be used as any of the liquid crystal panels 107R, 107G and 107B as light modulating means (light bulb). In the projection display device, a luminous flux density of the incident light to the liquid crystal panels 107R, 107G and 107B becomes high relative to a direct-view type liquid crystal display device. It is known that as the luminous flux density is higher, the burn-in becomes remarkable. Thus, any of the liquid crystal display devices (liquid crystal panels) according to Example 1 to Example 5 is especially suitable for being used as the light modulating means of the projection display device.

Then, in the projection display device, any of the liquid crystal display devices according to Example 1 to Example 5 is used as the light modulating means, resulting in that the ionic impurities in the liquid crystal layer of the effective pixel portion can be more reliably discharged to the dummy pixel portion. Therefore, the display having the burn-in, due to the ionic impurities in the liquid crystal layer of the effective pixel portion, which is less can be realized. As a result, it is possible to contribute to the improvement in the display quality of the projection display device.

Constitutions of the Present Disclosure

It should be noted that the present disclosure can also adopt the following constitutions.

[1]

A liquid crystal display device, including:

an effective pixel portion in which effective pixels contributing to display are arranged;

a dummy pixel portion which is provided adjacent to the effective pixel portion and in which dummy pixels not contributing to the display are arranged; and a pixel drive portion configured to drive the effective pixels of the effective pixel portion and the dummy pixels of the dummy pixel portion by reversing a voltage applied to a liquid crystal with a given period with a reference voltage as a center, in which the effective pixel portion and the dummy pixels each have a pixel transistor and a retention capacitor, and with respect to retention characteristics of a pixel electric potential in relation to the reference voltage, the retention characteristics of the dummy pixel portion are made asymmetrical relative to the retention characteristics of the effective pixel portion.

[2]

The liquid crystal display device according to [1] described above, in which characteristics of the pixel transistor are different between the effective pixels of the effective pixel portion and the dummy pixels of the dummy pixel portion.

[3]

The liquid crystal display device according to [2] described above, in which the pixel transistor has a low-concentrated impurity drain region, and a length of the low-concentrated impurity drain region of the dummy pixel is asymmetrical between one side of source/drain regions and the other side of the source/drain regions.

[4]

The liquid crystal display device according to [2] described above, in which the pixel transistor has a low-concentrated impurity drain region, and a concentration of the low-concentrated impurity drain region of the dummy pixel is asymmetrical between one side of source/drain regions and the other side of the source/drain regions.

[5]

The liquid crystal display device according to [2] described above, in which a film thickness of a gate insulating film in the dummy pixel is asymmetrical between one side of source/drain regions and the other side of the source/drain regions.

[6]

The liquid crystal display device according to [2] described above, in which the pixel transistor has a low-concentrated impurity drain region, and a contact portion for a gate electrode is formed in the vicinity of the low-concentrated impurity drain region along a gate length direction, and a distance between the low-concentrated impurity drain region and the contact portion in the dummy pixel is asymmetrical between one side of source/drain regions and the other side of the source/drain regions.

[7]

The liquid crystal display device according to [1] described above, in which a capacitance value of the retention capacitor of the dummy pixel is smaller than a capacitance value of the retention capacitor of the effective pixel.

[8]

The liquid crystal display device according to any one of [1] to [7] described above, in which the pixel drive portion carries out the same drive as that for the effective pixel for the dummy pixel.

[9]

The liquid crystal display device according to any one of [1] to [8] described above, in which an alignment film is formed on a liquid crystal side of a pixel electrode and a liquid crystal side of a counter electrode opposite to the pixel electrode, and the alignment film includes an oblique deposition film.

[10]

The liquid crystal display device according to any one of [1] to [9] described above, in which the dummy pixel is light-blocked.

[11]

An electronic apparatus having a liquid crystal display device including an effective pixel portion in which effective pixels contributing to display are arranged, a dummy pixel portion which is provided adjacent to the effective pixel portion and in which dummy pixels not contributing to the display are arranged, and a pixel drive portion configured to drive the effective pixels of the effective pixel portion and the dummy pixels of the dummy pixel portion by reversing a voltage applied to a liquid crystal with a given period with a reference voltage as a center, in which the effective pixel portion and the dummy pixels each have a pixel transistor and a retention capacitor, and with respect to retention characteristics of a pixel electric potential in relation to the reference voltage, the retention characteristics of the dummy pixel portion are made asymmetrical relative to the retention characteristics of the effective pixel portion.

REFERENCE SIGNS LIST

10 . . . Pixel, 11 . . . Thin film transistor (TFT), 12 . . . Pixel electrode, 13 . . . Retention capacitor, 14 . . . Common electrode, 20 . . . Pixel array portion, 21 . . . Effective pixel portion, 22 . . . Dummy pixel portion, 30A, 30B . . . Vertical drive portion, 40 . . . Horizontal drive portion, 51 ($51_1$, $51_2$, . . . , $51_m$) . . . Scanning line, 52 ($52_1$, $52_2$, . . . , $52_m$) . . . Signal line, 53 . . . Common line, 60 . . . Liquid crystal panel, 61 . . . Peripheral circuit portion, 62 . . . Alignment film on TFT substrate side, 63 . . . Alignment film on counter substrate side, 70 . . . Liquid crystal layer, 71 . . . Gate line (bottom gate), 72, 76 . . . Gate insulating film, 73 . . . Channel region, 74A . . . One of source/drain regions, 74B . . . The other of source/drain regions, 75 (75A, 75B) . . . LDD region (low-concentrated impurity drain), 77 . . . Gate electrode (top gate), 79A, 79B, 80A, 80B ... Contact portion, 82, 84 . . . Resist film, 83 . . . Insulating film, IP . . . Positive ionic impurities, IN . . . Negative ionic impurities, LC Liquid crystal molecule

The invention claimed is:

1. A liquid crystal display device, comprising:
a liquid crystal layer;
an effective pixel portion comprising a plurality of effective pixels that contributes to display of an image;
a dummy pixel portion comprising a plurality of dummy pixels, wherein
the dummy pixel portion is adjacent to the effective pixel portion, and
the plurality of dummy pixels does not contribute to the display of the image; and
a pixel drive portion configured to drive the plurality of effective pixels of the effective pixel portion and the plurality of dummy pixels of the dummy pixel portion by reversal of a voltage applied to the liquid crystal layer, wherein
the reversal of the voltage is with a given period with a reference voltage as a center,
each effective pixel of the plurality of effective pixels and each dummy pixel of the plurality of dummy pixels comprise a pixel transistor and a retention capacitor, and
with respect to the reference voltage, retention characteristics of a pixel electric potential of the dummy pixel portion are asymmetrical relative to retention characteristics of a pixel electric potential of the effective pixel portion.

2. The liquid crystal display device according to claim 1, wherein characteristics of the pixel transistor are different between the plurality of effective pixels of the effective pixel portion and the plurality of dummy pixels of the dummy pixel portion.

3. The liquid crystal display device according to claim 2, wherein
the pixel transistor includes a low-concentrated impurity drain region and source/drain regions, and
a length of the low-concentrated impurity drain region of a dummy pixel of the plurality of dummy pixels is asymmetrical between a first side of the source/drain regions and a second side of the source/drain regions.

4. The liquid crystal display device according to claim 2, wherein
the pixel transistor includes a low-concentrated impurity drain region and source/drain regions, and
a concentration of the low-concentrated impurity drain region of a dummy pixel of the plurality of dummy pixels is asymmetrical between a first side of the source/drain regions and a second side of the source/drain regions.

5. The liquid crystal display device according to claim 2, wherein a film thickness of a gate insulating film in a dummy pixel of the plurality of dummy pixels is asymmetrical between a first side of source/drain regions of the pixel transistor and a second side of the source/drain regions.

6. The liquid crystal display device according to claim 2, wherein
the pixel transistor includes a low-concentrated impurity drain region, a gate electrode, and source/drain regions, and
a contact portion for the gate electrode is in a vicinity of the low-concentrated impurity drain region along a gate length direction, and
a distance between the low-concentrated impurity drain region in a dummy pixel of the plurality of dummy pixels and the contact portion in the dummy pixel is asymmetrical between a first side of the source/drain regions and a second side of the source/drain regions.

7. The liquid crystal display device according to claim 1, wherein a capacitance value of the retention capacitor of a dummy pixel of the plurality of dummy pixels is smaller than a capacitance value of the retention capacitor of an effective pixel of the plurality of effective pixels.

8. The liquid crystal display device according to claim 1, wherein the pixel drive portion is further configured to carry out a same drive for an effective pixel of the plurality of effective pixels and a dummy pixel of the plurality of dummy pixels.

9. The liquid crystal display device according to claim 1, further comprising:
an alignment film that includes an oblique deposition film;
a pixel electrode; and
a counter electrode, wherein
the alignment film is on each of a liquid crystal side of the pixel electrode and a liquid crystal side of the counter electrode, and
the counter electrode is opposite to the pixel electrode.

10. The liquid crystal display device according to claim 1, wherein each dummy pixel of the plurality of dummy pixels is light-blocked.

11. An electronic apparatus, comprising:
a liquid crystal display device including:
a liquid crystal layer;
an effective pixel portion comprising a plurality of effective pixels that contributes to display of an image;
a dummy pixel portion comprising a plurality of dummy pixels, wherein
the dummy pixel portion is adjacent to the effective pixel portion, and
the plurality of dummy pixels does not contribute to the display of the image; and
a pixel drive portion configured to drive the plurality of effective pixels of the effective pixel portion and the plurality of dummy pixels of the dummy pixel portion by reversal of a voltage applied to the liquid crystal layer, wherein the reversal of the voltage is with a given period with a reference voltage as a center, each effective pixel of the plurality of effective pixels and each dummy pixel of the plurality of dummy pixels comprise a pixel transistor and a retention capacitor, and with respect to the reference voltage, retention characteristics of a pixel electric potential of the dummy pixel portion are asymmetrical relative to retention characteristics of a pixel electric potential of the effective pixel portion.

12. A liquid crystal display device, comprising:

a liquid crystal layer;

an effective pixel portion comprising a plurality of effective pixels that contributes to display of an image;

a dummy pixel portion comprising a plurality of dummy pixels, wherein the dummy pixel portion is adjacent to the effective pixel portion, and the plurality of dummy pixels does not contribute to the display of the image; and a pixel drive portion configured to drive the plurality of effective pixels of the effective pixel portion and the plurality of dummy pixels of the dummy pixel portion by reversal of a voltage applied to the liquid crystal layer, wherein the reversal of the voltage is with a given period with a reference voltage as a center, each effective pixel of the plurality of effective pixels and each dummy pixel of the plurality of dummy pixels comprise a pixel transistor and a retention capacitor, characteristics of the pixel transistor are different between the plurality of effective pixels of the effective pixel portion and the plurality of dummy pixels of the dummy pixel portion, the pixel transistor includes a low-concentrated impurity drain region and source/drain regions, a concentration of the low-concentrated impurity drain region of a dummy pixel of the plurality of dummy pixels is asymmetrical between a first side of the source/drain regions and a second side of the source/drain regions, and with respect to the reference voltage, retention characteristics of a pixel electric potential of the dummy pixel portion are asymmetrical relative to retention characteristics of a pixel electric potential of the effective pixel portion.

* * * * *